(12) United States Patent
Nagasawa

(10) Patent No.: US 8,917,507 B2
(45) Date of Patent: Dec. 23, 2014

(54) COOLING DEVICE, ELECTRONIC SUBSTRATE AND ELECTRONIC DEVICE

(75) Inventor: Hideo Nagasawa, Oiso (JP)

(73) Assignee: Molex Incorporated, Lisle, IL (US)

( * ) Notice: Subject to any disclaimer, the term of this patent is extended or adjusted under 35 U.S.C. 154(b) by 231 days.

(21) Appl. No.: 13/264,793

(22) PCT Filed: Apr. 16, 2010

(86) PCT No.: PCT/US2010/031526
§ 371 (c)(1),
(2), (4) Date: Oct. 17, 2011

(87) PCT Pub. No.: WO2010/121230
PCT Pub. Date: Oct. 21, 2010

(65) Prior Publication Data
US 2012/0033385 A1    Feb. 9, 2012

(30) Foreign Application Priority Data

Apr. 16, 2009 (JP) .............................. 2009-100009
Sep. 4, 2009 (JP) .............................. 2009-204676

(51) Int. Cl.
| | |
|---|---|
| H05K 7/20 | (2006.01) |
| F28F 7/00 | (2006.01) |
| H01L 23/34 | (2006.01) |
| H05K 1/02 | (2006.01) |
| H01L 23/427 | (2006.01) |

(52) U.S. Cl.
CPC ............ *H01L 23/427* (2013.01); *H05K 1/0272* (2013.01); *H05K 1/0207* (2013.01); *H05K 1/0206* (2013.01); *H05K 2203/083* (2013.01)

USPC ........... 361/699; 361/700; 361/720; 257/714; 257/715; 165/80.4

(58) Field of Classification Search
None
See application file for complete search history.

(56) References Cited

U.S. PATENT DOCUMENTS

| | | | |
|---|---|---|---|
| 5,245,508 A | 9/1993 | Mizzi | |
| 5,510,958 A | 4/1996 | Shimabara et al. | |
| 5,763,951 A * | 6/1998 | Hamilton et al. | 257/714 |
| 6,365,260 B1 * | 4/2002 | Stecher et al. | 428/138 |
| 6,657,871 B2 * | 12/2003 | Perino et al. | 361/760 |
| 6,788,537 B2 | 9/2004 | Saita et al. | |
| 7,061,104 B2 * | 6/2006 | Kenny et al. | 257/714 |
| 7,176,382 B1 * | 2/2007 | Shi et al. | 174/254 |

(Continued)

FOREIGN PATENT DOCUMENTS

| | | |
|---|---|---|
| CN | 1851908 A | 10/2006 |
| JP | 10-247702 | 9/1998 |
| WO | 2007/026833 A1 | 3/2007 |

OTHER PUBLICATIONS

International Search Report for PCT/US2010/031526.

*Primary Examiner* — Boris Chervinsky
(74) *Attorney, Agent, or Firm* — Timothy M. Morella

(57) ABSTRACT

A cooling device is provided. The cooling device is equipped with an electronic substrate on which a heating element has been mounted, and comprises a thermal diffusion unit of a plate-like shape. A front surface of the thermal diffusion unit thermally contacts a first circuit mounting surface of the electronic substrate. A rear face of the thermal diffusion unit thermally contacts a second circuit mounting surface of the electronic substrate. And, the thermal diffusion unit diffuses heat from the heating element according to vaporization and condensation principles of a refrigerant sealed therein.

24 Claims, 31 Drawing Sheets

(56) References Cited

U.S. PATENT DOCUMENTS

| | | | |
|---|---|---|---|
| 7,215,547 B2* | 5/2007 | Chang et al. | 361/701 |
| 7,259,965 B2* | 8/2007 | Chang et al. | 361/699 |
| 7,298,623 B1* | 11/2007 | Kuczynski et al. | 361/719 |
| 7,345,877 B2* | 3/2008 | Asfia et al. | 361/700 |
| 7,352,591 B2* | 4/2008 | Sugahara | 361/760 |
| 7,479,406 B1 | 1/2009 | Yamada et al. | |
| 7,583,506 B1* | 9/2009 | Huang et al. | 361/719 |
| 7,817,407 B2* | 10/2010 | Tanaka | 361/679.02 |
| 7,888,603 B2* | 2/2011 | Lu et al. | 174/252 |
| 8,243,449 B2* | 8/2012 | Oniki et al. | 361/700 |
| 8,264,841 B2* | 9/2012 | Sasaki et al. | 361/699 |
| 8,356,657 B2* | 1/2013 | Zhao et al. | 165/104.26 |
| 8,593,810 B2* | 11/2013 | Yoshikawa et al. | 361/700 |
| 2004/0022026 A1* | 2/2004 | Belady et al. | 361/700 |
| 2004/0212965 A1 | 10/2004 | Ishii et al. | |
| 2008/0087456 A1* | 4/2008 | Schuette | 174/252 |
| 2008/0121414 A1* | 5/2008 | Lee et al. | 174/252 |
| 2009/0120669 A1* | 5/2009 | Hoofman | 174/252 |
| 2011/0038122 A1* | 2/2011 | Ahangar et al. | 361/700 |

* cited by examiner

COOLING DEVICE, ELECTRONIC SUBSTRATE AND ELECTRONIC DEVICE

REFERENCE TO RELATED DOCUMENTS

The Present Disclosure claims priority to prior-filed Japanese Patent Application No. 2009-100009, entitled "Cooling Device, Electronic Substrate and Electronic Device," and filed 16 Apr. 2009; and prior-filed Japanese Patent Application No. 2009-204676, entitled "Cooling Device, Electronic Substrate and Electronic Device," and filed 4 Sep. 2009. The contents of both Japanese Patent Applications are fully incorporated in their entireties herein.

BACKGROUND OF THE PRESENT DISCLOSURE

The Present Disclosure relates to a cooling device for refrigerating an electronic substrate, as well as the heating element mounted on the substrate and in contact therewith, and further relates to the substrate and an electronic device equipped with the cooling device.

Heating elements and electronic components, such as semiconductor integrated circuits, LED elements and power devices, have been used for electronic devices, industrial equipment, automobiles or the like. When the temperature in the elements or the components becomes higher than a constant, a problem may occur in that that operation thereof can not be guaranteed. As a result, an influence on other parts, as well as performance degradation of the elements, components or the industrial apparatus themselves, may be also caused. In many cases, the elements and the components, which generate the heat, are mounted on an electronic substrate.

In order to cool these elements and components, a heat sink, including a plurality of fins and/or a liquid-cooled jacket is provided. However, there is a space limit where the heat sink, the liquid-cooled jacket or similar device are disposed, due to the downsizing of the electronic devices and industrial equipment in recent years. In addition, electronic substrates are highly integrated in electronic devices and the industrial equipment. As such, it is advantageous to provide a cooling device that cools the substrates with high efficiency.

When cooling the heating element, the technology of improving the thermal contact between a cooling device and a target has been proposed. As an example, see Japanese Patent Application No. 2008-077434 ("the '434 Application"). The technology of providing a heat pipe on the front surface of an target has been also proposed, with the heat pipe combining a heat receiving unit that takes heat from an electronic part, a transporting unit that transports heat from the heat receiving unit and a heat radiating unit that radiates the transported heat with fins. As another example, see Japanese Patent Application No. 2004-037001 ("the '001 Application").

There are, however, problems with the conventional technology. The technology disclosed in the '434 Application is inapplicable to electronic devices required to be downsized or thinned. This is because the technology needs a compression member, such as a blade spring, in addition to the cooling device. Furthermore, according to the disclosure of the '434 Application, a plurality of electronic substrates cannot be cooled efficiently. In addition, according to disclosure of the '434 Application, it is also difficult to diffuse heat received from the heating element inside the electronic devices that have only narrow spaces.

The technology disclosed in the '001 Application is also inapplicable to downsized electronic devices. This is because heat taken from the heating element is radiated from a radiating unit via a connection path, and the cooling device is required to be large. In addition, when a plane-spreading heat pipe is equipped with an electronic part having a predetermined shape and structure, the heat pipe may not match the shape and a structure of the substrate.

As mentioned above, conventional cooling devices cannot simultaneously and efficiently cool a number of electronic substrates without disturbing downsized electronic devices and the industrial equipment that the substrates are mounted therein. Furthermore, in conventional systems, heat received from the substrate or the element cannot efficiently be radiated.

In view of the above-mentioned problems, an object according to the Present Disclosure is to provide a cooling device, an electronic substrate and an electronic device that can optimally and efficiently cool a number of electronic substrates mounted in a narrow space.

SUMMARY OF THE PRESENT DISCLOSURE

In order to solve the above-mentioned problems, there is provided a cooling device equipped with an electronic substrate on which a heating element has been mounted, the cooling device comprising a thermal diffusion unit of a plate-like shape. A front surface of the thermal diffusion unit thermally contacts a first circuit mounting surface of the electronic substrate. A rear face of the thermal diffusion unit thermally contacts a second circuit mounting surface of the electronic substrate. And, the thermal diffusion unit diffuses heat from the heating element according to vaporization and condensation principles of a refrigerant sealed therein.

The cooling device disclosed in the Present Disclosure enables the simultaneous cooling of a plurality of electronic substrates or multilayer substrates mounted in narrow spaces with a single thermal diffusion unit. Since the cooling device can simultaneously cool a plurality of electronic substrates or multilayer substrates, the downsizing of the electronic devices is not disturbed. Further, utilizing the narrow spaces and the electronic devices themselves with high efficiency, the cooling device can radiate heat taken from the heating element. Additionally, when the cooling device simultaneously cools the electronic substrates or multilayer substrates, the cooling device does not disturb the electrical connection between the circuitry. Thus, the cooling device of the Present Disclosure can cool a heating element with high efficiency, flexibly corresponding to structures and shapes of the substrates or narrow spaces.

One aspect of the Present Disclosure includes a cooling device equipped with an electronic substrate on which a heating element is mounted. The device preferably comprises a thermal diffusion unit of a plate-like shape. A front surface of the unit thermally contacts a first circuit mounting surface of the substrate. A rear face of the unit thermally contacts a second circuit mounting surface of the substrate. And, the unit diffuses heat from the element according to vaporization and condensation properties of a refrigerant sealed therein. This arrangement enables the cooling device to simultaneously or individually cool a plurality of circuit mounting surfaces. The cooling device can flexibly cool the circuit mounting surfaces in accordance with the structure or a contact mode of the circuit mounting surfaces.

A further aspect of the Present Disclosure includes a cooling device wherein, when the electronic substrate is a multilayer substrate including a plurality of circuit layers, the first and second circuit mounting surfaces are circuit layers included in the multilayer substrate. The circuit layers thermally contact with a portion of a front surface, a rear face and a side of the thermal diffusion unit. This arrangement enables the cooling device to simultaneously or individually cool the circuit mounting surfaces. The cooling device can flexibly cool the circuit mounting surfaces in accordance with the structure or as a contact mode of the circuit mounting surfaces. The thermal diffusion unit may be laminated as one circuit layer included in the multilayer substrate, or may be built in inside of the multilayer substrate.

A further aspect of the Present Disclosure includes a cooling device wherein, when the electronic substrate is composed of a plurality of circuit boards, the first and second circuit mounting surfaces are one circuit board included in the plurality of circuit boards. This arrangement enables the cooling device to simultaneously or individually cool the circuit mounting surfaces. The cooling device can flexibly cool the circuit mounting surfaces in accordance with the structure or as a contact mode of the circuit mounting surfaces.

A further aspect of the Present Disclosure includes a cooling device wherein the thermal diffusion unit thermally contacts with at least one of the heating element mounted on the first and second circuit mounting surfaces. This arrangement enables the thermal diffusion unit to take heat from the heating element mounted on the circuit mounting surfaces. As a result, a cooling device can simultaneously cool the circuit mounting surfaces.

A further aspect of the Present Disclosure includes a cooling device wherein the thermal diffusion unit thermally contacts with a portion of the heating element via a thermal interface. This arrangement reduces the thermal resistance between the unit and the heating element.

A further aspect of the Present Disclosure includes a cooling device wherein the thermal diffusion unit comprises an upper plate, a lower plate and one or more intermediate plate laminated therebetween. A refrigerant is sealed in an internal space formed joining the plates. And, the intermediate plates form at least one of a vapor diffusion path and a capillary channel. According to this arrangement, the thermal diffusion unit is constituted with a heat pipe of a plate-like shape. Accordingly, the thermal diffusion unit can easily take heat from the circuit mounting surface (with which the unit thermally contacts). Furthermore, the diffusion unit can diffuse the taken heat in plane and thickness directions, and can radiate the heat outward.

A further aspect of the Present Disclosure includes a cooling device wherein the intermediate plates include a notched part and an internal through-hole. The notched part forms the vapor diffusion path. The internal through-hole forms the capillary channel. The vapor diffusion path horizontally and vertically diffuses an evaporated refrigerant, and the capillary channel causes a condensed refrigerant to horizontally and vertically circulate. This arrangement enables the heat taken from the heating element to be diffused with high efficiency.

A further aspect of the Present Disclosure includes a cooling device wherein the intermediate plates are composed of a plurality of boards, and wherein the internal through-holes formed in the plurality of boards partially overlap with each other, thereby forming the capillary channel possessing a cross-sectional area smaller than the cross-sectional areas in a horizontal direction of the internal through-holes. This arrangement enables increased capillary attraction of the capillary channel, and the thermal diffusion unit can circulate the refrigerant efficiently.

A further aspect of the Present Disclosure includes a cooling device wherein each of the upper and lower plates comprise a recess part communicating with at least one of the capillary channel and the vapor diffusion path. This arrangement enables the thermal diffusion unit to diffuse vaporized refrigerant in both plane and vertical directions. Further, condensed refrigerant circulates in both the plane and vertical directions.

A further aspect of the Present Disclosure includes a cooling device comprising a connection member that thermally contacts at least a part of a side of the thermal diffusion unit. This arrangement enables the cooling device to conduct the heat diffused by the thermal diffusion unit for further process.

A further aspect of the Present Disclosure includes a cooling device comprising an extension board extending from a part of the side surface, the front surface and the rear surface of the thermal diffusion unit, wherein the connection member is equipped with the extension board. This arrangement enables the connection member to easily connect to the thermal diffusion unit. When an end of the thermal diffusion unit cannot protrude from an end of the electronic substrate on which the thermal diffusion unit is mounted, the extension board enables the connection member to easily connect to the thermal diffusion unit.

A further aspect of the Present Disclosure includes a cooling device wherein the extension board performs at least one of transporting the heat from the thermal diffusion unit and radiating the heat. A further aspect of the Present Disclosure includes a cooling device wherein the extension board extends outside the electronic substrate. These arrangements enable the cooling device to radiate heat diffused by the diffusion unit to outside the electronic substrate.

A further aspect of the Present Disclosure includes a cooling device comprising a heat radiating unit that radiates heat transported by the extension board. This arrangement enables the cooling device to radiate heat conducted by the extension board with high efficiency.

A further aspect of the Present Disclosure includes a cooling device wherein the heat radiating unit is at least one of a heat sink, a case storing the electronic substrate, a liquid-cooled jacket, a heat radiating board or a cooling fan. This arrangement enables the cooling device to radiate heat conducted by the extension board with high efficiency.

A further aspect of the Present Disclosure includes a cooling device wherein the extension board is a board member including an attaching part that is equipped at least with a part of the side of the thermal diffusion unit. This arrangement enables the extension board constituted independently from the diffusion unit to be later-equipped with the diffusion unit.

A further aspect of the Present Disclosure includes a cooling device wherein at least one of the upper plate, the lower plate and the intermediate plates possess an area larger than the other, thereby forming the extension board. In this arrangement, the diffusion unit and the extension board are integrally formed, reducing thermal resistance from the unit to the board.

A final aspect of the Present Disclosure a cooling device wherein the thermal diffusion unit further comprises a via that electrically connects the first and second circuit mounting surfaces. This arrangement enables the cooling device to electrically connect the first circuit mounting surface and the second circuit mounting surface.

These and other objects, features and advantages of the Present Disclosure will be clearly understood through a consideration of the following detailed description.

BRIEF DESCRIPTION OF THE FIGURES

The organization and manner of the structure and operation of the Present Disclosure, together with further objects and advantages thereof, may best be understood by reference to the following Description, taken in connection with the accompanying Figures, wherein like reference numerals identify like elements, and in which.

DESCRIPTION OF THE PREFERRED EMBODIMENTS

Figure 1:
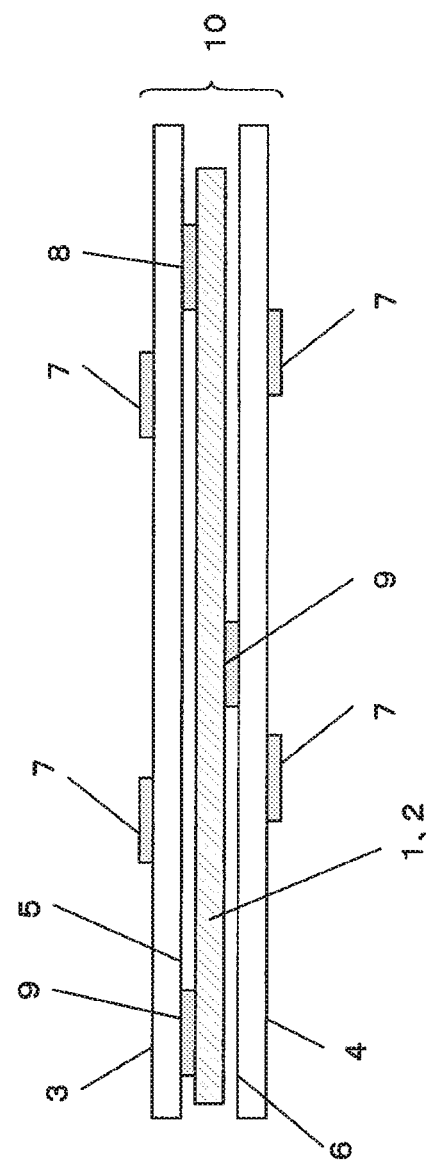
FIG. 1 is a side view of an electronic substrate according to the Present Disclosure.

While the Present Disclosure may be susceptible to embodiments in different forms, there is shown in the Figures, and will be described herein specific embodiments, with the understanding that the disclosure is to be considered an exemplification of the principles of the Present Disclosure, and is not intended to limit the Present Disclosure to that as illustrated. In the illustrated embodiments, directional representations—i.e., up, down, left, right, front, rear and the like, used for explaining the structure and movement of the various elements of the Present Disclosure, are relative. These representations are appropriate when the elements are in the position shown in the Figures. If the description of the position of the elements changes, however, it is assumed that these representations are to be changed accordingly.

A refrigerant sealed in an internal space of a heat pipe evaporates heat from a heat element, and then the evaporated refrigerant is condensed by refrigeration. By way of example, a "heat pipe," in the Present Disclosure, means a member, a part or a device that realizes a function of refrigerating a heat element by repeating such process. Further, the "heat pipe" includes the word "pipe." By way of example, the "pipe" of a member is not an essential element of the heat pipe. Thus, a "heat pipe" is a general name of a device operable to cool a heated element according to the evaporation and condensation properties of the refrigerant.

An electronic substrate 10, on which heating elements 7, 8, and 9 are mounted, is equipped with a cooling device 1. The cooling device 1 includes a thermal diffusion unit 2 of a plate-like shape. A front surface of the thermal diffusion unit 2 thermally contacts a first circuit mounting front surface 5 of an electronic substrate 10, and a rear surface of the thermal diffusion unit 2 thermally contacts a second circuit mounting surface 6 of the electronic substrate 10. The thermal diffusion unit 2 receives and diffuses heat from the heating elements 7, 8, and 9 according to the vaporization and condensation properties of a refrigerant sealed therein. It is preferable that the cooling device 1 be equipped with an electronic substrate. Further, the cooling device 1 may be provided with the thermal diffusion unit 2 of a plate-like shape, and is preferably equipped with the electronic substrate 10 of a plate-like shape.

Figure 2:
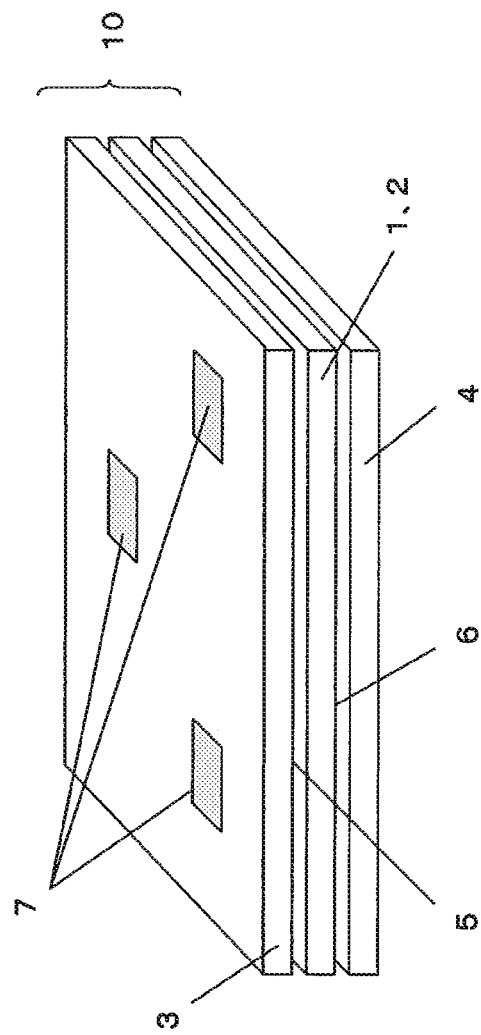
FIG. 2 is a perspective diagram of the electronic substrate of FIG. 1.

FIGS. 1-2 illustrate a structure in which the electronic substrate 10 includes a plurality of circuit boards 3 and 4. The circuit board 3 constitutes the first circuit mounting surface 5, and the circuit board 4 constitutes the second circuit mounting surface 6. Preferably, a front surface of the thermal diffusion unit 2 thermally contacts the circuit board 3 of the first circuit mounting surface 5, and a rear face of the thermal diffusion unit 2 thermally contacts the circuit board 4 of the second circuit mounting surface 6. That is, the thermal diffusion unit 2 is sandwiched between the circuit board 3 and the circuit board 4.

Since the front surface of the thermal diffusion unit 2 thermally contacts the circuit board 3, the front surface of the thermal diffusion unit 2 also thermally contacts the heating elements 7 and 8 mounted on the circuit board 3. This contact enables the thermal diffusion unit 2 to receive heat from the heating elements 7 and 8 mounted on the circuit board 3, and to diffuse the heat. Similarly, since the rear face of the thermal diffusion unit 2 thermally contacts the circuit board 4, the rear face of the thermal diffusion unit 2 also thermally contacts the heating elements 7 and 9 mounted on the circuit board 4. This contact enables the thermal diffusion unit 2 to receive heat from the heating elements 7 and 8 mounted on the circuit board 4, and to diffuse the heat.

Thus, the cooling device 1 illustrated in FIGS. 1-2 can simultaneously cool the circuit boards 3 and 4 possessed by the electronic substrate 10. Alternatively, since the thermal diffusion unit 2 is inserted between the plurality of circuit boards 3 and 4, at least one of the plurality of circuit boards 3 and 4 can be cooled without increasing a mounting space of the electronic substrate 10. In particular, in many electronic devices, a plurality of circuit boards are often mounted in close proximity. Providing the thermal diffusion unit 2 between the plurality of circuit boards enables the cooling device 1 to flexibly cool the electronic substrate.

Figure 3:
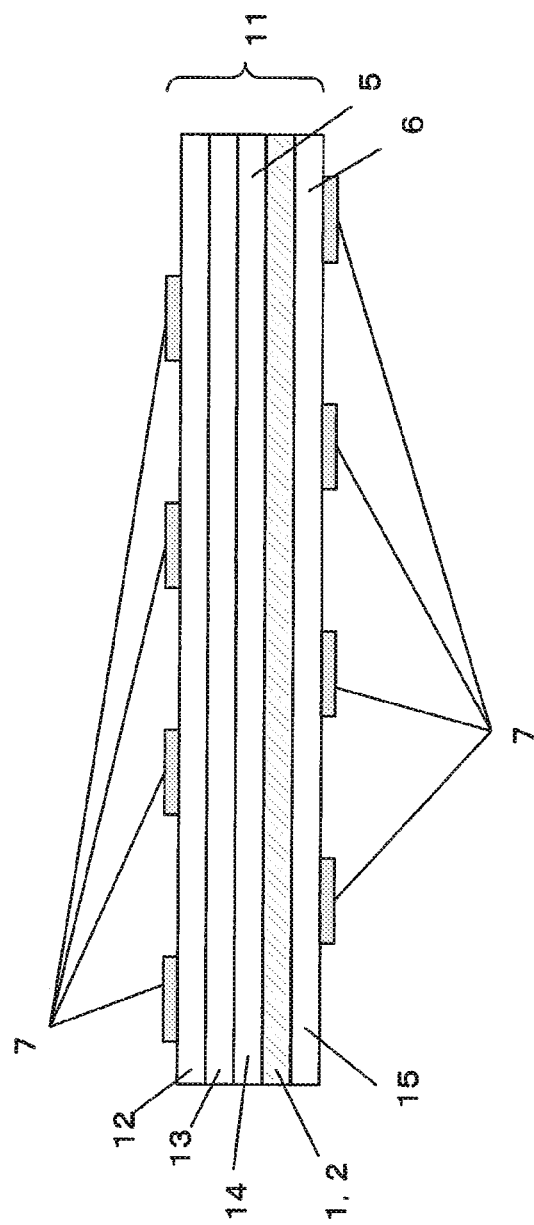
FIG. 3 is another side view of the electronic substrate of FIG. 1.
Figure 4:
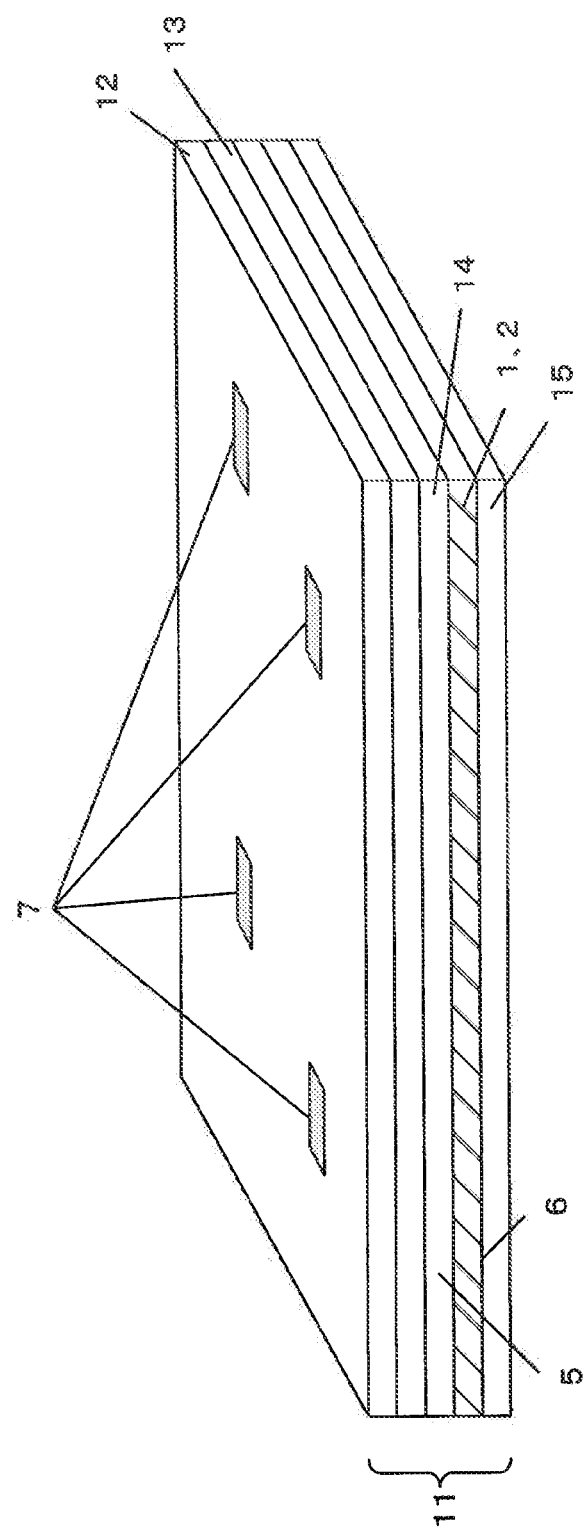
FIG. 4 is a perspective diagram of the electronic substrate of FIG. 1.

As illustrated in FIGS. 3-4, the thermal diffusion unit 2 may be equipped in an inner layer of the multilayer substrate 11. In many cases, many electronic substrates are multilayer substrates, including a plurality of circuit layers. The multilayer substrate is constituted by laminating a plurality of circuit layers, and heating elements, such as an electronic part and a circuit pattern, are implemented on each of the plurality of circuit layers. The multilayer substrate 11 in FIGS. 3-4 includes four-layer circuit layers 12, 13, 14, and 15, and the thermal diffusion unit 2 is equipped being inserted between the circuit layers 14 and 15.

Additionally, the thermal diffusion unit 2 is arranged in an inner layer of the multilayer substrate 11. As a result, the front surface of the thermal diffusion unit 2 thermally contacts the circuit layer 14 of the first circuit mounting front surface 5, and the rear face of the thermal diffusion unit 2 thermally contacts the circuit layer 15 of the second circuit mounting surface 6. Each circuit layer 14 and 15 mounts the heating element 7 thereon, and the thermal diffusion unit 2 receives heat from these heating elements, which is then diffused. When the thermal diffusion unit 2 diffuses the heat, then the heating element 7 is cooled. When the heating element 7 is cooled, and then the multilayer substrate 11 is also cooled.

Thus, the cooling device 1 illustrated in FIGS. 3-4 can simultaneously cool the plurality of circuit layers 14 and 15 included in the multilayer substrate 11. Alternatively, since the thermal diffusion unit 2 is equipped being inserted between the plurality of circuit layers 14 and 15, at least one of the circuit layers 14 and 15 can be cooled without increasing a mounting space of the multilayer substrate 11. Not only from the circuit layers 14 and 15 with which thermal diffusion unit 2 thermally contacts, but also from the circuit layers 12 and 13, the thermal diffusion unit 2 can receive heat, and the entire of the multilayer substrate 11 can be cooled from inside.

Herein, the electronic substrate 10 of FIGS. 1-2 is provided with three or more circuit boards, and the thermal diffusion units 2 may be equipped being inserted between the three or more circuit boards. The multilayer substrate 11 of FIGS. 3-4 preferably includes four circuit layers; however, the multilayer substrate 11 may include a different number of layers.

The thermal diffusion unit 2 thermally contacts at least with a part of heating elements mounted on the first circuit mounting surface 5 and the second circuit mounting surface, and receives heat from the heating elements. In this case, the thermal diffusion unit 2 may contact thermally at least with a part of the heating elements mounted on the first circuit mounting surface 5 and the second circuit mounting surface via thermal interface material. As for the thermal interface material, thermal grease, and filler or the like-added thermal grease is used. Such thermal interface material is applied on a contact surface of the heating element and the thermal diffusion unit 2. When the thermal diffusion unit 2 thermally contacts with the heating element via the thermal interface material, bad influence caused by surface unevenness is reduced comparing with a case where the thermal diffusion unit 2 directly contacts with the heating element not via the thermal interface material. For this reason, thermal resistance against heat moving from the heating element to the thermal diffusion unit 2 is reduced.

Thus, when the thermal diffusion unit 2 thermally contacts with the heating element via the thermal interface material, the heat diffusion unit 2 more easily receives heat form the heating element comparing with a case where the thermal diffusion unit 2 directly contacts with the heating element not via the thermal interface material.

When the thermal diffusion unit 2 is inserted into inner layers of the multilayer substrate, or the plurality of circuit boards, the thermal diffusion unit 2 may contact thermally with the first circuit mounting surface and the second circuit mounting surface not only via the thermal interface material applied to the heating element, but also via the thermal interface material applied to the first circuit mounting surface and the second circuit mounting surface themselves.

Figure 5:
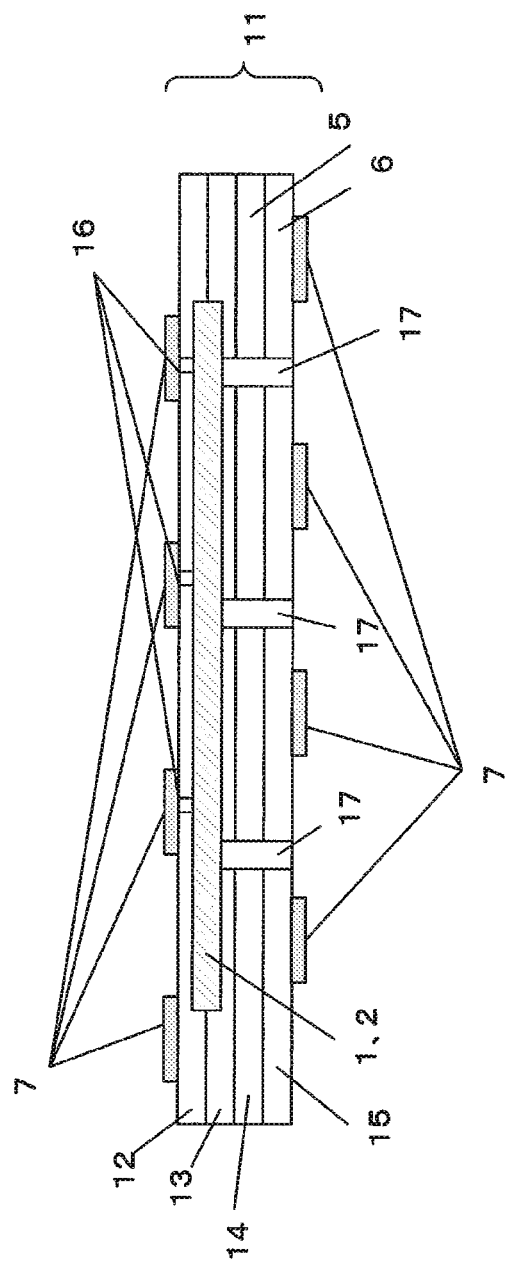
FIG. 5 is another side view of the electronic substrate of FIG. 1.

Herein, as illustrated in FIG. 3 and FIG. 4, the thermal diffusion unit 2 may be constituted by laminating as one layer of the multilayer substrate 11 including a plurality of circuit layers (the thermal diffusion unit 2 may be sandwiched between respective adjacent two layers of the multilayer substrate 11), or the thermal diffusion unit 2 may be completely built in the multilayer substrate 11 as illustrated in FIG. 5. When the thermal diffusion unit 2 is laminated as one layer of the multilayer substrate 11 including a plurality of circuit layers, the circuit layers thermally contact with a part or all part of the front surface and the rear face of the thermal diffusion unit 2. On the other hand, when the thermal diffusion unit 2 is completely built in the multilayer substrate 11, the circuit layers thermally contact with the front surface, the rear face, and the side of the thermal diffusion unit 2.

FIG. 5 illustrates a state where the thermal diffusion unit 2 is built in inside of the multilayer substrate 11. When seeing FIG. 5 as an electronic substrate, FIG. 5 is regarded as a figure of an electronic substrate that the thermal diffusion unit 2 is builds therein. When seeing FIG. 5 as a cooling device, FIG. 5 is regarded as a figure of a cooling device 1 that the thermal diffusion unit 2 is built in the multilayer substrate 11.

In FIG. 5, the thermal diffusion unit 2 is built between the circuit layers 12 and 13 included in the multilayer substrate 11. Building the thermal diffusion unit 2 in the multilayer substrate 11 enables to realize the electronic substrate ready-made possessing a refrigerating function.

For example, suppose that the multilayer substrate of a predetermined size that a thermal diffusion unit has been built therein is supplied. Since such a multilayer substrate possesses cooling capacity with the thermal diffusion unit build therein, the user of the multilayer substrate can determine arrangement of electronic parts on the multilayer substrate according to the cooling capacity, position and area of the thermal diffusion unit built therein. For example, an electronic part with more calorific value is arranged in a position opposing to the thermal diffusion unit built therein, and an electronic part with less calorific value is arranged in a position not opposing to the thermal diffusion unit built therein. Furthermore, in a thickness direction of the multilayer substrate, the electronic part with more calorific value is arranged in a side near the thermal diffusion unit.

Thus, providing a multilayer substrate (an electronic substrate) that the thermal diffusion unit has been built therein (may be in a lamination state as illustrated in FIG. 3, or may be in a state completely built in as illustrated in FIG. 5) enables to easily achieve electronic arrangement of circuit patterns while considering heat-refrigerating on a multilayer substrate or an electronic substrate.

In FIG. 5, the thermal diffusion unit 2 receives heat from the heating element 7 mounted on the front surface of the circuit layer 12 in the thickness direction of the circuit layer 12. At this time, a portion between the heating element 7 and the thermal diffusion unit 2 may be buried with the circuit layer 12, or a thermal via of a through hole that conducts heat according to air conduction may be provided at the portion.

When the thermal diffusion unit 2 receives heat from the heating element 7 mounted on the circuit layer 12, the thermal diffusion unit 2 diffuses the received heat in inside thereof. The diffused heat is conducted to the rear face of the thermal diffusion unit 2. Via the circuit layers 13, 14, and 15, the heat conducted to the rear face of the thermal diffusion unit 2 is conducted to the rear face of the multilayer substrate 11, and is radiated to the open air. That is, the heat of the heating element 7 mounted on the front surface (namely, the surface of the multilayer substrate 11) of the circuit layer 12 is radiated to the open air and cooled from the front surface (namely, the rear face of the multilayer substrate 11) of the circuit layer 15.

Herein, the heat from the rear face of the thermal diffusion unit 2 may be physically conducted to the circuit layers 13, 14, and 15, and further may be conducted to the rear face of the multilayer substrate 11. As illustrated in FIG. 5, the heat may be, however, conducted by the thermal via 17 of the through hole conducting heat with air. In FIG. 5, the via-hole 16 aiming at electrical conduction is illustrated between the surface of the circuit layer 12 and the thermal diffusion unit 2, and the thermal via 17 aiming at heat conduction is not illustrated. The thermal via aiming at heat conduction, however, may be provided between the front surface of the circuit layer 12 and the thermal diffusion unit 2.

Since the thermal via 17 penetrates a portion from the rear face of the thermal diffusion unit 2 to the front surface of the circuit layer 15, the thermal via 17 conducts the heat diffused to the rear face of the thermal diffusion unit 2. Finally, the conducted heat is conducted from the rear face of the multilayer substrate 11 to the open air via the thermal via 17. As a result, the heat of the heating element 7 mounted on the front surface of the circuit layer 12 is exhausted to outside of the multilayer substrate 11 via thermal via 17.

A heat move route wherein the thermal diffusion unit 2 receives the heat of the heating element 7 mounted on the front surface of the circuit layer 15, and the heat diffused by the thermal diffusion unit 2 from the front face of the circuit layer 12 is radiated to the open air is also achieved. Alternatively, by controlling the direction of thermal diffusion of the thermal diffusion unit 2, the thermal diffusion unit 2 receives the heat of the heating element 7 mounted on the front surface of the circuit layer 12, and exhausts the heat from the circuit layer 15 to the open air. Furthermore, the thermal diffusion unit 2 receives the heat of the heating element 7 mounted on the front surface of the circuit layer 15, and exhausts the heat from the circuit layer 12 to the open air.

Herein, the thermal via 17 does not have to penetrate completely from the thermal diffusion unit 2 to the circuit layer, and a part or all of ends of the thermal via 17 may be covered with a thin protective film, or the like. This is because the heat conducted by the thermal via 17 is exhausted to the open air even in such a case.

Preferably, the thermal diffusion unit 2 and the circuit layer thermally contacts via thermal interface material. Herein, the thermal interface material may be applied to at least one of the thermal diffusion unit 2 and the circuit layer. The thermal interface material causes to reduce unevenness of the contact surface between the thermal diffusion unit 2 and the circuit layer, thereby also reducing thermal resistance in heat conduction.

When the thermal diffusion unit 2 is formed of material with high electrical conductivity, such as copper, aluminum, or the like, the thermal diffusion unit 2 can be utilized as an electronic member on an electronic substrate. For example, as illustrated in FIG. 5, the via-hole 16 that electrically conducts between the heating elements 7, which is mounted on the front surface of the circuit layer 12 and is an electronic part that operates in response to an electronic signal, and the thermal diffusion units 2 is provided. The via-hole 16 electrically connects the heating element 7 and the thermal diffusion unit 2, and enables to exchange electronic signals there-between. For example, the thermal diffusion unit 2 can play a role of a return way of current from the heating element 7, or can work as an escape way of current. The thermal diffusion unit 2 can also play a role of tread (ground plane).

Thus, when the via-hole enabling electric connection, or the thermal via enabling heat conduction is provided with the multilayer substrate or the electronic substrate that builds therein or laminates the thermal diffusion unit 2, electric performance of the multilayer substrate or the electronic substrate is improved, and heat-exhausting capacity thereof is also improved. Without suppressing to enlarge multilayer substrates or electronic substrates themselves, these merits are obtained especially in this case.

The circuit boards 3 and 4 and the multilayer substrate 11 are examples of electronic substrates built onto various kinds of electronic devices and industrial equipment. The circuit boards 3 and 4 and the multilayer substrate 11 include electronic parts, electronic elements, circuit patterns, or the like.

One face of the thermal diffusion unit 2 tends to be a heat-receiving front surface (face taking heat from a heat source), and another face of the thermal diffusion unit 2 tends to be a heat radiating surface (face radiating diffused heat). For this reason, when sandwiching the thermal diffusion unit 2 between the plurality of circuit boards 3 and 4, or when sandwiching the thermal diffusion unit 2 between inner layers of the multilayer substrate 11, it is preferable that more heating elements are mounted on circuit boards or circuit layers in contact with a face operable to be a heat-receiving surface, and further that less heating elements are mounted on circuit boards or circuit layers in contact with a face operable to be a heat radiating surface. Alternatively, it is also preferable that the heating element is mounted on a first area of the circuit boards or circuit layers in contact with the face operable to be the heat-receiving surface, the first area opposing to near the center of the thermal diffusion unit 2, and further that the heating element is mounted on a second area of the circuit boards or circuit layers in contact with the face operable to be the heat radiating surface, the second area not opposing to the thermal diffusion unit 2.

As an example, in circuit boards to be mounted on a digital camera or a digital camcorder, various electronic parts are mounted on circuit boards and circuit layers in contact with the heat-receiving surface of the thermal diffusion unit 2. Electronic parts with little calorific value, such as a photo acceptance unit, are preferably mounted on the circuit boards and circuit layers in contact with the heat-receiving surface of the thermal diffusion unit 2.

Thus, in the cooling device 1, the thermal diffusion unit 2 is sandwiched between a plurality of circuit boards and circuit layers, thereby simultaneously and flexibly refrigerating the plurality of circuit boards and circuit layers. Herein, determining mounting patterns of the circuit boards and circuit layers in accordance with characteristics of heat-receiving and heat-radiating of the thermal diffusion unit 2 enables the cooling device 1 to cool the electronic substrates with high efficiency while suppressing adverse effects.

When the thermal diffusion unit 2 is constituted such that from a side thereof radiates the received heat as mentioned below, mounting patterns of a plurality of circuit boards and circuit layers sandwiching the thermal diffusion unit there-between need not be considered so much.

Next, details of the thermal diffusion unit 2 will be explained. The cooling device 1 includes the thermal diffusion unit 2 that thermally contacts with a first circuit mounting surface and a second circuit mounting surface of an electronic substrate.

As an example, the thermal diffusion unit 2 is formed with a board member of metal with high thermal conductivity, alloy, resin, or the like. As an example of material, metal with high thermal conductivity such as copper, aluminum, tungsten, titanium, resin with high durability, or the like is preferably used.

The board member formed of such material receives heat from the heating element, and diffuses it towards a rim. Thus, since the thermal diffusion unit 2 includes the board member formed of the material with high thermal conductivity, the thermal diffusion unit 2 can receive heat from circuit boards or circuit layers with which the thermal diffusion unit 2 thermally contacts, and can diffuse the heat.

The thermal diffusion unit 2 preferably includes a heat pipe of a plate-like shape that diffuses heat from the heating element according to vaporization and condensation of a sealed refrigerant.

In the following, a case where the thermal diffusion unit 2 includes the heat pipe will be explained referring to FIG. 6 to FIG. 8.

Figure 6:
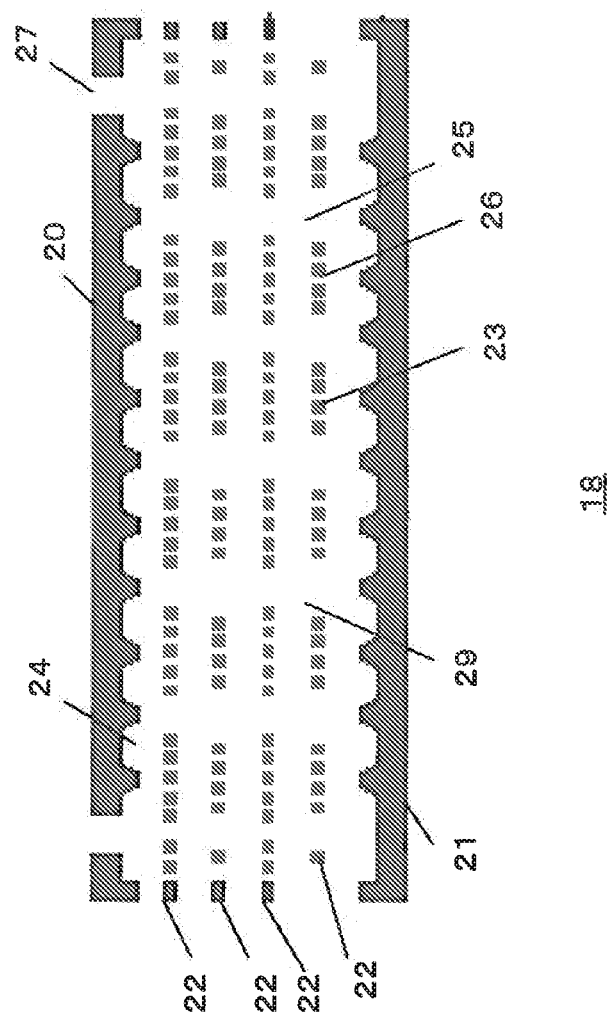
FIG. 6 is a side exploded view of a heat pipe according to the Present Disclosure.

FIG. 6 is a side exploded view of a heat pipe according to the Present Disclosure. FIG. 7 is a view of an upper surface of an intermediate plate included in the heat pipe according to the Present Disclosure. FIG. 8 is an internal photograph of the heat pipe according to the Present Disclosure.

First, concept of a heat pipe will be explained. The heat pipe seals a refrigerant in the inside thereof, and possesses a heat-receiving surface in contact with the heating element including an electronic part. The internal refrigerant is heated by the heating element to evaporate, and takes the heat of the heating element when evaporating. The vaporized refrigerant circulates in the inside of the heat pipe. The flow carries the heat of the heating element. The flowing and vaporized refrigerant is cooled to be condensed at a heat radiating surface, or the like (or a secondary cooling member, such as a heat sink and a cooling fan). The refrigerant condensed to be a liquid circulates in inside of a heat pipe, and moves to a heat-receiving surface again. The refrigerant moved to the heat-receiving surface is evaporated again, and takes the heat of the heating element.

Repetition of vaporization and condensation discussed above causes the heat pipe to cool the heating element. For this reason, the heat pipe needs to include: a vapor diffusion path for diffusing the refrigerant therein; and a capillary channel for flowing back the condensed refrigerant.

The heat pipe 18 is provided with an upper plate 20 of a plate-like shape, the lower plate 21 opposing to the upper plate 20, and one of a plurality of intermediate plates 22 laminated between the upper plate 20 and the lower plate 21. An internal space is formed by joining the upper plate 20, the lower plate 21, and the intermediate plates 22, and the heat received heat from the heating element is diffused according to vaporization and condensation of the refrigerant sealed in this internal space.

The intermediate plates 22 is provided with a notched part 29 and the internal through hole 23. The notched part 29 forms the vapor diffusion path 25 where a vaporized refrigerant diffuses, and the internal through hole 23 forms the capillary channel 26 where the condensed refrigerant circulates.

An upper plate will now be explained using FIG. 6. An upper plate 20 is a plate-like shape, and possesses the predetermined shape and area.

Although the upper plate 20 is formed of metal, resin, or the like, it is preferably formed of metal with high thermal conductivity, such as copper, aluminum, silver, aluminum alloy, iron, iron alloy, and stainless steel, or rust-free (high durability) metal. The upper plate 20 may be of one of various shapes, such as a rectangle, a lozenge, a circle, an ellipse, and a polygon. The rectangle is tends to be adapted considering ease of manufacturing and mounting thereof.

It is preferable that a recess part 24 communicating with at least one of the vapor diffusion path 25 and the capillary channel 26 is provided with a surface of the upper plate 20. The condensed refrigerant is easily conducted from the upper plate 20 to the capillary channel 26 when the recess part 24 communicates with the capillary channel 26. Alternatively, the vaporized refrigerant easily contacts with the heat radiating surface within a wide area, thereby promoting heat radiation of the evaporated refrigerant, when the recess part 24 communicates with the vapor diffusion path 25. Furthermore, the vaporized refrigerant can move to the recess part 24 to spread also in the thickness direction when the recess part 24 communicates with the vapor diffusion path 25. As a result, the heat pipe 18 diffuses the received heat in plane and thickness directions.

When the thermal diffusion unit 2 is horizontally arranged to the earth surface, the plane direction is horizontal to the earth surface, and the thickness direction is perpendicular to the earth surface. When the thermal diffusion unit 2 is on a tilt or vertically arranged to the earth surface, the plane direction is a plane direction of the thermal diffusion unit 2 of a plate-like shape, and the thickness direction is the thickness direction of the thermal diffusion unit 2 of the plate-like shape.

It is also suitable for the upper plate 20 to provide with a projection joined to the intermediate plates 22 and an adhesion part. For convenience, the upper plate 20 is called as "upper", however, the plate does not need to be a upside position physically, and does not need to be distinguished from the lower plate 21 specifically. Moreover, there is no specific problem whether the upper plate 20 is near to the heat radiating surface or the heat receiving surface.

Moreover, the upper plate 20 is provided with an injection port 27 of the refrigerant. When the upper plate 20, the intermediate plates 22, and the lower plate 21 are laminated and connected, an internal space will be formed. Since the internal space needs to seal the refrigerant, the refrigerant is entered from the injection port 27 after connection of the upper plate 20 or the like. When the refrigerant is entered, the injection port 27 is sealed. Then, the internal space is sealed.

The refrigerant may be sealed from the injection port 27 after lamination and the refrigerant may be also sealed when the upper plate 20, the lower plate 21, and the intermediate plates 22 are being laminated.

The lower plate 21 opposes to the upper plate 20, and sandwich one or a plurality of the intermediate plates 22 there-between.

Although the lower plate 21 is formed of metal, resin, or the like, they are preferably formed of metal with high thermal conductivity, such as copper, aluminum, silver, aluminum alloy, iron, iron alloy, and stainless steel, or rust-free (high durability) metal. The lower plate 21 may be of one of various shapes, such as a rectangle, a lozenge, a circle, an ellipse, and a polygon. Since the heat pipe 18 is formed opposing to the upper plate 20, it is preferable that the shape and the volume are the same as those of the upper plate 20. The rectangle is tends to be adapted considering ease of manufacturing and mounting thereof.

The lower plate 21 preferably includes a recess part 24 communicating with the vapor diffusion path 25 and the capillary channel 26 on a surface thereof opposing to the intermediate plates 22. Providing the lower plate 21 with the recess part 24 possesses the same meaning as providing the upper plate 20 with the recess part 24.

For convenience, the lower plate 21 is called as "lower", however, the plate does not need to be a lower position physically, and does not need to be distinguished from the upper plate 20 specifically.

It is also suitable for the lower plate 21 to provide with a projection joined to the intermediate plates 22 and an adhesion part.

Moreover, there is no specific problem whether the lower plate 21 is near to the heat radiating surface or the heat receiving surface.

The one or plurality of intermediate plates 22 are laminated between the upper plate 20 and the lower plate 21.

Although the intermediate plates 22 is formed of metal, resin, or the like, it is preferably formed of metal with high thermal conductivity, such as copper, aluminum, silver, aluminum alloy, iron, iron alloy, and stainless steel. Moreover, the intermediate plate may be of one of various shapes, such as a rectangle, a lozenge, a circle, an ellipse, and a polygon. Since the heat pipe 18 is formed by sandwiching the upper plate 20 and the lower plate 21, it is preferable that the upper plate 20 and the lower plate 21 of the same shape. Areas of the intermediate plates 22 may be the same as those of the upper plate 20 and the lower plate 21, or may be slightly less than those.

The intermediate plates 22 may include a projection and an adhesion part used when connecting to the upper plate 20 and the lower plate 21. In addition, the intermediate plates 22 include the internal through hole 23 having a minute cross-section area. This internal through hole 23 forms the capillary channel 26.

Finally, the intermediate plates 22 are laminated and connected between the upper plate 20 and the lower plate 21, thereby forming the heat pipe 18. The intermediate plates 22 may be composed of one board or a plurality of boards. However, in order to form the capillary channel 26 having a minuter cross-section area as mentioned later, the intermediate plates 22 are preferably composed of the plurality of boards.

Next, the intermediate plates 22, the vapor diffusion path 25, and the capillary channel 26 will be explained, also referring to FIG. 7. First, the vapor diffusion path 25 will be explained. The intermediate plates 22 includes a notched part 29 and the internal through hole 23.

The notched part 29 forms the vapor diffusion path 25 in the heat pipe 18. When the intermediate plates 22 are laminated between the upper plate 20 and the lower plate 21, then the notched part 29 forms an opening. This opening forms the vapor diffusion path 25.

The notched part 29 is formed towards a plane direction of the heat pipe 18, and then the vapor diffusion path 25 is also formed towards the plane direction of the heat pipe 18. For this reason, the vaporized refrigerant is diffused in the plane direction. In addition, since the notched part 29 is connected to the upper plate 20 and the lower plate 21, and the vapor diffusion path 25 is connected from the upper plate 20 to the lower plate 21. Furthermore, the recess part 24 provided with the upper plate 20 and the lower plate 21 communicates with the vapor diffusion path 25. As a result, the vapor diffusion path 25 diffuses the evaporated refrigerant in the plane and thickness directions.

Figure 7:
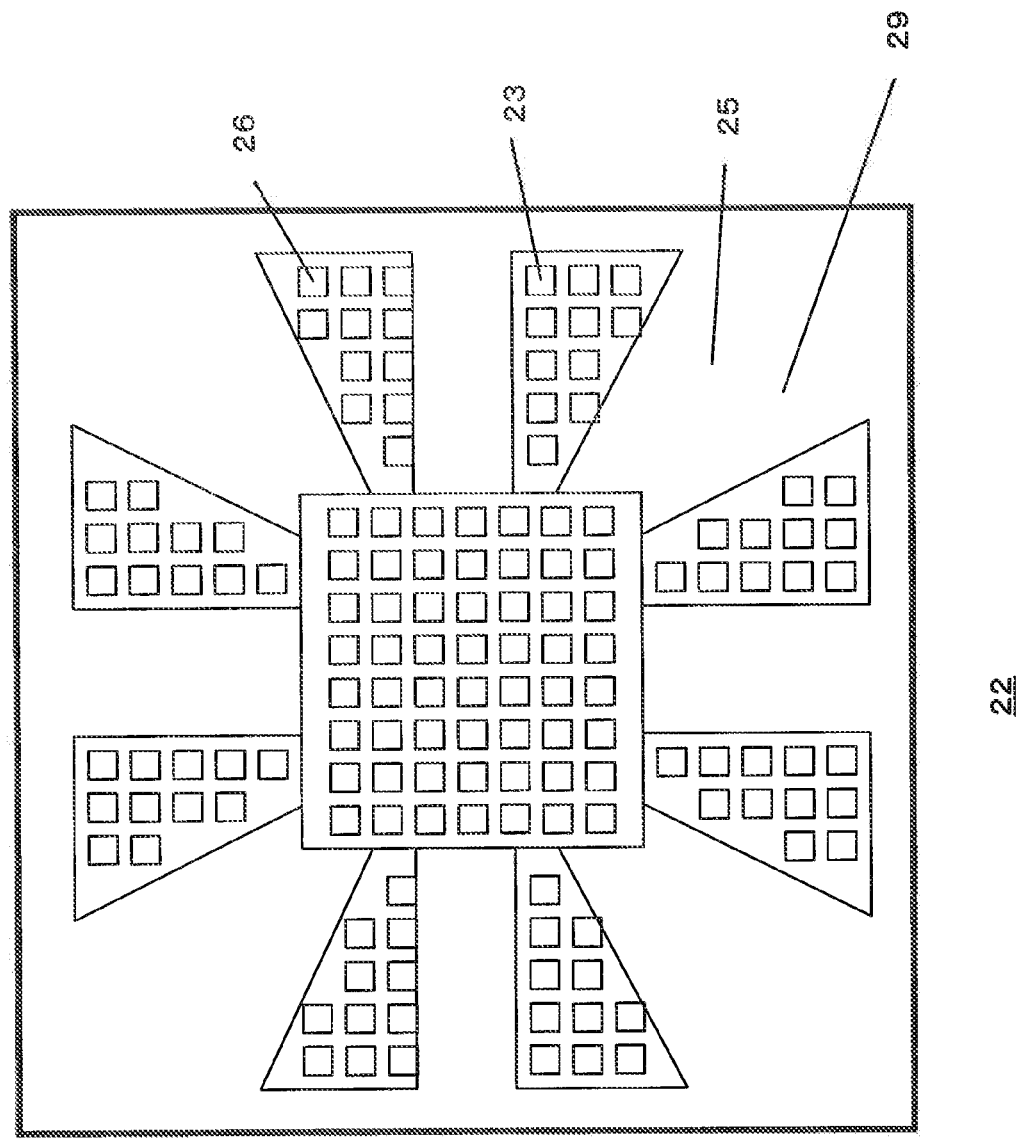
FIG. 7 is a view of a surface of an intermediate plate of the heat pipe of FIG. 6.

As especially illustrated in FIG. 7, when the notched part 29 is radially formed from the central part of the intermediate plates 22, the vapor diffusion path 25 is also radially formed from the central part of the heat pipe 18. In many cases the heating element is arranged in a substantially central part of the heat pipe 18, the refrigerant receives heat in most in the substantially central part of the heat pipe 18. For this reason, the refrigerant near the central part of the heat pipe 18 evaporates first. At this time, the vapor diffusion path 25 easily and radially diffuses the refrigerant vaporized near the substantially central part of the heat pipe 18.

Thus, the intermediate plates 22 includes the notched part 29 to form the vapor diffusion path 25 spreading in plane and thickness directions, and the refrigerant evaporated in inside of the heat pipe 18 is diffused in the plane and thickness directions. As a result, the heat from the heating element is diffused in inside of the heat-pipe 18 in the plane and thickness directions.

The vapor diffusion path 25 may be of the radial shape shown in FIG. 7, or of another shape.

Next, the capillary channel 26 will be explained. The intermediate plates 22 include the internal through hole 23. The internal through hole 23 is a minute through hole, and forms the capillary channel 26 where the condensed refrigerant circulates. As illustrated in FIG. 3, when the intermediate plates 22 includes the notched part 29, the internal through hole 23 is formed in portions other than the notched-part 29.

Herein, when the intermediate plates 22 is composed of one number, the internal through hole 23 provided in the intermediate plates 22 becomes the capillary channel as it is.

On the other hand, when the intermediate plates 22 is composed of a plurality of members, only a part of internal through hole 23 provided in each of the plurality of intermediate plates 22 overlaps with each other, and the capillary channel 26 having a cross-section area smaller than the cross-section area of the internal through hole 23 in the plane direction is formed. Thus, since the capillary channel 26 having the cross-section area smaller than the cross-section area of the internal through hole 23 itself is formed when the intermediate plates 22 is composed of a plurality of members, circulating of the condensed refrigerant in the capillary channel 26 can be made more effective. This is because the capillary channel 26 makes the refrigerant condensed circulate according to capillarity, thereby promoting to circulation of the refrigerant caused by the small cross-section area of the capillary channel 26.

A plurality of internal through holes 23 are formed in the intermediate plates 22. This is because the internal through holes 23 is preferably plural considering a function as the capillary channel 26.

The internal through hole 23 penetrates the intermediate plates 22 from the front surface to the rear face thereof, and a shape thereof may be a circle, an ellipse, or a rectangle. Considering that only the part of internal through hole 23 overlaps to form the capillary channel 26, the internal through hole 23 is preferably of a rectangle. This is suitable also considering ease of manufacturing.

The internal through hole 23 may be formed by digging, pressing, wet etching, dry etching, or the like. It is preferably formed by etching process, such as wet etching, dry etching, or the like considering minute processing and processing precision.

When the intermediate plates 22 is composed of a plurality of members, the internal through hole 23 is formed in each of the plurality of intermediate plates 22. Herein, since the plurality of intermediate plates 22 are laminated so that the parts of the internal through holes 23 only partially overlap, respectively, positions of the internal through holes 23 preferably shift every adjacent intermediate plate 22. For example, a position of an internal through hole 23 in a certain intermediate plate 22 and a position of an internal through hole 23 in an intermediate plate 22 adjacent to the certain intermediate plate 22 shift so that only parts of these internal through holes 23 overlap. Thus, since the positions of the internal through holes 23 shift every adjacent intermediate plates 22, the capillary channel 26 having a cross-section area smaller than the cross-section area of the internal through hole 23 in the plane direction is formed.

Holes having the cross-section area smaller than the cross-section area of the internal through hole 23 are laminated in the vertical direction of the heat pipe 18, and then a vertical path is formed. The holes are stairs-like in the vertical direction, the path allowing flow not only in the vertical direction but also in the horizontal direction is formed. The cross-section area of the path formed in the vertical and horizontal directions is very small, and causes the condensed refrigerant to circulate in the vertical and horizontal directions.

There is also a merit that the capillary channel 26 can be made more easily than a case where it is directly made when causing only parts of the internal through holes 23 to overlap, thereby forming the capillary channel 26 whose cross-section area is smaller than that of the internal through hole 23.

The condensed refrigerant normally circulates the capillary channel 26, and the vaporized refrigerant may also pass through it.

Angle parts of the capillary channel 26, the recess part 24, and the notched part 29 are preferably beveled and/or rounded. The section of the capillary channel 26 may have one of various shapes, such as a hexagon, a circle, an ellipse, a rectangle, a polygon, or the like. The section of the capillary channel 26 is determined according to the shapes of the internal through holes 23, and how the internal through holes 23 overlap. The cross-section area is determined similarly.

The heat pipe 18 is manufactured by laminating and connecting the upper plate 20, the lower plate 21, and the intermediate plates 22.

Each of the upper plate 20, the lower plate 21, and the plurality of intermediate plates 22 (the number of intermediate plates 22 is four in FIG. 6) is set up in a manner such that each of them overlaps in the same position. In addition, the plurality of intermediate plates 22 are set up according to positional relationship that only a part of each internal through hole 23 provided in each of the plurality of intermediate plates 22 overlaps.

At least one of the upper plate 20, the lower plate 21, and the plurality of the intermediate plates 22 possess a projection to be connected.

The upper plate 20, the lower plate 21, and the plurality of intermediate plates 22 are arranged with respect to their positions and are directly joined by heat press to be unified.

The directly joining means to cause faces of two members to adhere with other and press them, thereby adding heat treatment to them. Due to this, atoms of the faces are firmly connected according to atomic force acting between the faces, and the faces of the two members can be unified without using adhesives. Herein, the directly joining realizes solid connection.

As for a condition for the direct joining in the heat press, pressure is preferably of 40 kg/cm2 to 150 kg/cm2, and temperature is preferably of 250 to 400° C.

The refrigerant is entered via an inlet port 27 opened at a part of the upper plate 20 or the lower plate 21. The inlet port 27 is closed, and then manufacturing the heat pipe 18 is completed. Entering the refrigerant is performed under a vacuum or decompression. By performing the entering under the vacuum or the decompression, the internal space of the heat pipe 18 is under the vacuum or the decompression, and then the refrigerant is sealed. Under the decompression, temperature of vaporization and condensation of the refrigerant becomes low, and there is a merit that repetition of the vaporization and condensation is promoted.

According to the above process, the heat pipe 18 of a plate-like shape of an example of the thermal diffusion unit 2 is manufactured.

Figure 8:
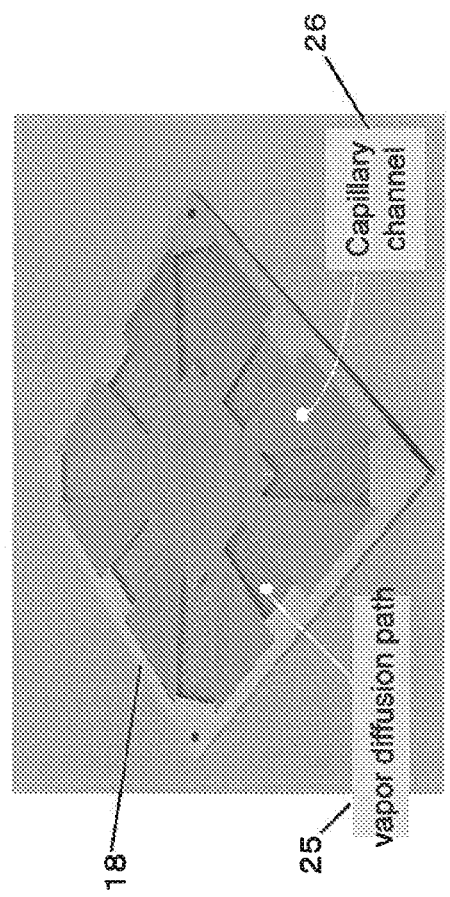
FIG. 8 is an internal photograph of the heat pipe of FIG. 6.

Thus, the internal structure of a thus manufactured heat pipe 18 is illustrated in FIG. 8.

When the above-mentioned heat pipe 18 is used as the thermal diffusion unit 2 of a cooling device 1, heat from the heating element can be diffused with high efficiency. For this reason, the plurality of circuit boards and circuit layers that sandwich the thermal diffusion unit 2 are cooled with high efficiency by the cooling device 1. Especially, thanks to the structures and shapes of the vapor diffusion path 25 and the capillary channel 26, the thermal diffusion unit 2 can control a diffusion direction of the received heat. As a result, restriction to the mounting configuration of electronic parts or circuit patterns on the plurality of circuit boards and circuit layers that sandwich the thermal diffusion unit 2 also is reduced. For example, what is necessary is just to change the internal structure of the heat pipe 18 according to the mounting configuration of the electronic parts on the plurality of circuit boards that sandwich the thermal diffusion unit 2. For example, when a circuit board on which many electronic parts gather near the center of the heat pipe 18 should be cooled, as illustrated in FIG. 7, the heat pipe 18 including the vapor diffusion path 25 that radially spreads from the center to the periphery is used as the thermal diffusion unit 2. On the contrary, when the circuit board on which many electronic parts gather near the end of the heat pipe 18 should be cooled, as illustrated in FIG. 9, the heat pipe 18 including the vapor diffusion path 25 running from an end to anther end is used as the thermal diffusion unit 2.

Figure 9:
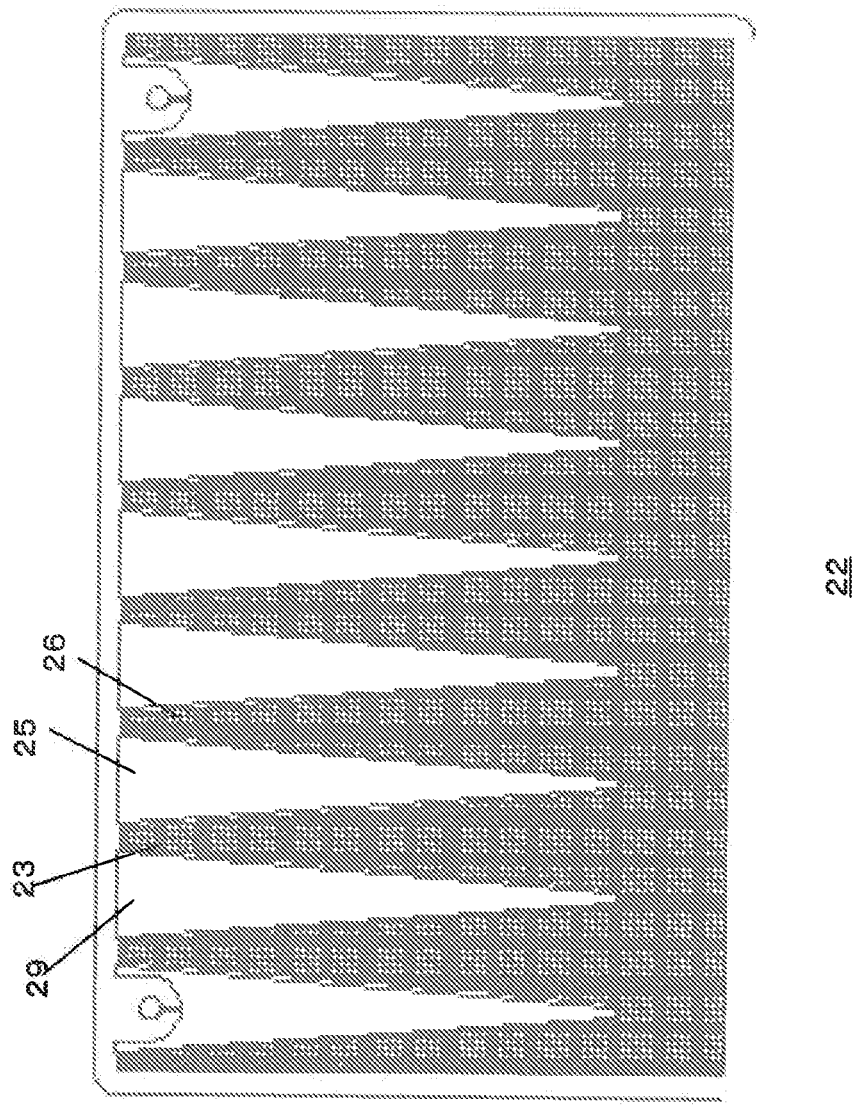
FIG. 9 is another view of the surface of the intermediate plate of the heat pipe of FIG. 6.

FIG. 9 is a view of an upper surface of the intermediate plates according to the Present Disclosure. FIG. 9 illustrates the intermediate plates 22 (namely, heat pipe 18) that the vapor diffusion path 25 and the capillary channel 26 are formed from an end to another end. Since the heat pipe provided with the vapor diffusion path 25 and the capillary channel 26 illustrated in FIG. 9 are used as the thermal diffusion unit 2, heat is diffused from the end to the other end. For this reason, the cooling device 1 having the heat pipe of FIG. 9 is preferable to cool the electronic substrate or the circuit board on which many electronic parts gather near the end of the thermal diffusion unit 2.

As mentioned above, the cooling device can simultaneously and flexibly cool a plurality of circuit boards possessed by an electronic substrate, or circuit layers possesses by a multilayer substrate.

Additionally, a cooling device may be provided with a connection member on a side of the thermal diffusion unit, and a cooling device provided with a secondary cooling member that radiates heat diffused by the thermal diffusion unit are explained.

Figure 10:
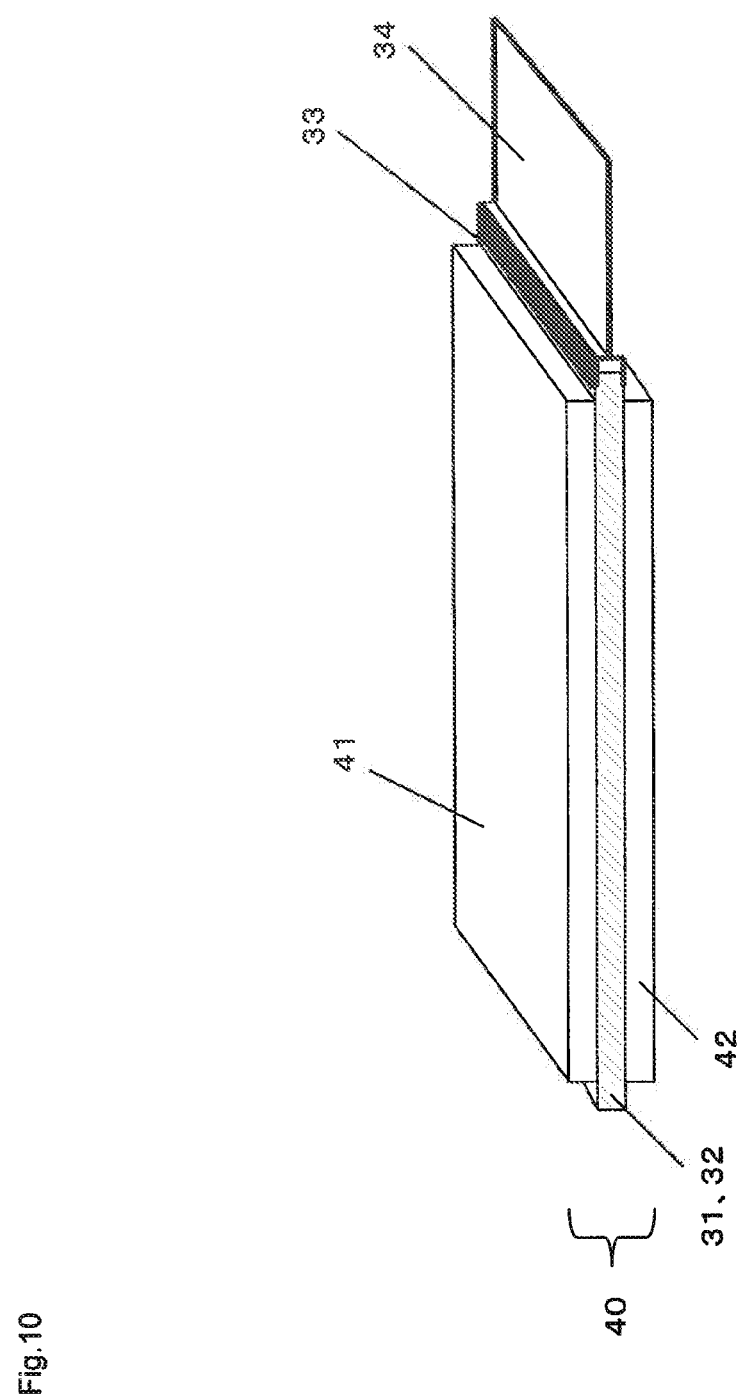
FIG. 10 is a perspective diagram of an electronic substrate equipped with a cooling device according to the Present Disclosure.
Figure 11:
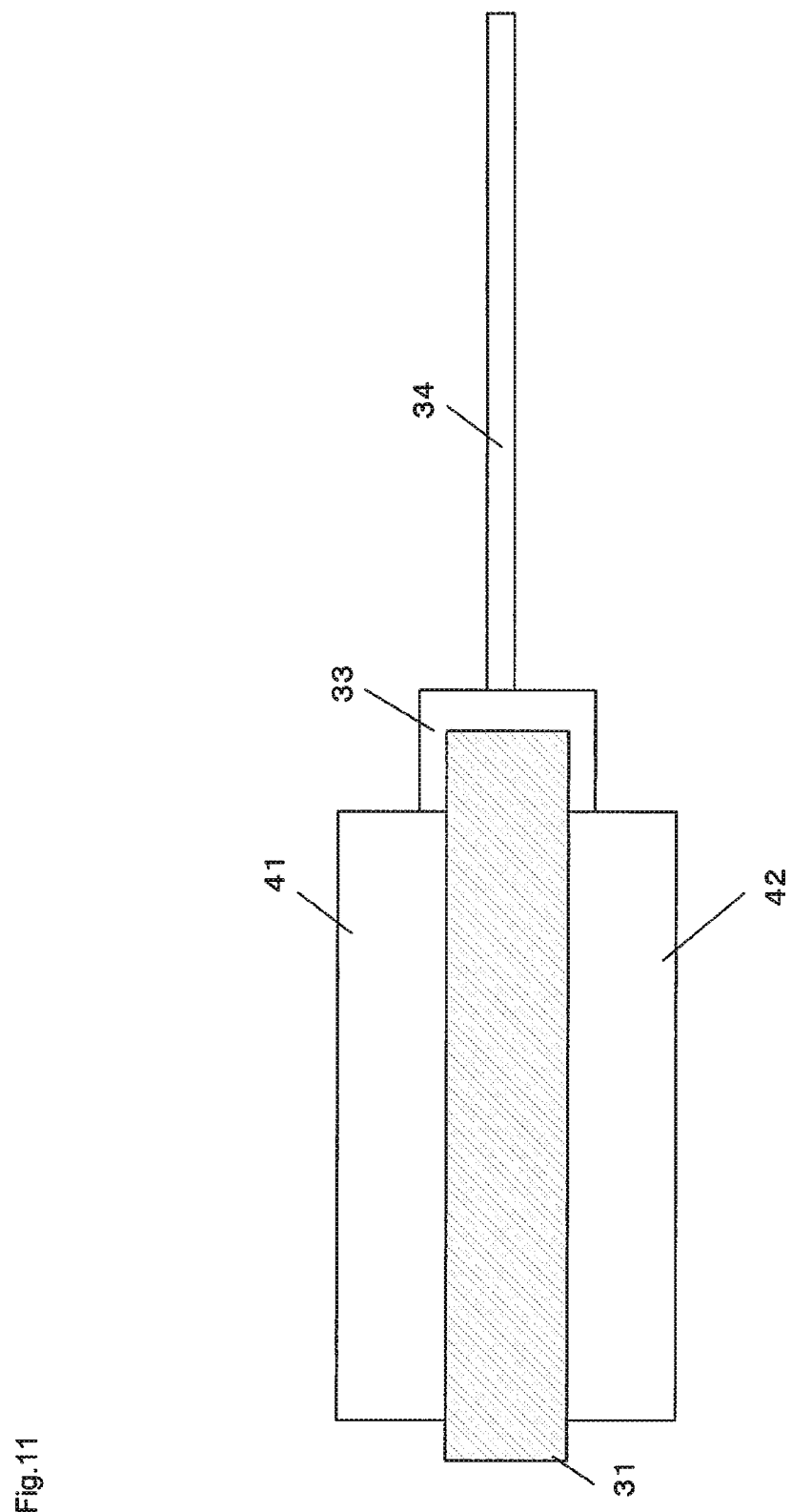
FIG. 11 is a side view of the electronic substrate of FIG. 10.

First, referring to FIG. 10 and FIG. 11, the cooling device provided with the connection member on a side of the thermal diffusion unit is explained. The connection member thermally contacts at least with a part of the side. FIG. 10 is a perspective diagram of an electronic substrate equipped with the cooling device of the Present Disclosure, and FIG. 11 is a side view of the electronic substrate equipped with the cooling device.

A cooling device 31 is provided with a thermal diffusion unit 32. As previously explained, the thermal diffusion unit 32 may be a board member formed of metal, resin, or the like, and may also be a heat pipe of a plate-like shape. An electronic substrate 40 is provided with a plurality of circuit boards 41 and 42. The thermal diffusion unit 31 is sandwiched and equipped between the circuit board 41 and the circuit board 42. That is, the thermal diffusion unit 31 simultaneously or individually receives heat from the circuit board 41 and the circuit board 42, and diffuses the received heat. The electronic substrate 40 may be provided with the plurality of circuit boards 41 and 42, or may be a multilayer substrate provided with a plurality of circuit layers.

The thermal diffusion unit 31 is further provided with a connection member 33 thermally contacting at least with a part of a side of the thermal diffusion unit 32. The connection member 33 further connects a heat radiating board 34.

The connection member 33 has the role of an intermediate part member for connecting the thermal diffusion unit 32 and another member (In FIG. 10 and FIG. 11, the heat radiating board 34). In order to be equipped with a side of the thermal diffusion unit 32, the connection member 33 includes engaging nails, an insert slot, or the like. The connection member 33 may be a connector. The connection member 33 may thermally contact with the thermal diffusion unit 32 via thermal interface material.

For example, as illustrated in FIG. 11, the connection member 33 is equipped biting the side of the thermal diffusion unit 32. The connection member 33 can connect other various members. For example, as illustrated in FIG. 10 and FIG. 11, a heat radiating board 34 is connectable. The side of the thermal diffusion unit 32 is equipped with the connection member 33, members other than the heat-radiating-board 34, such as a heat transport member and a secondary cooling member, can also be connected, and heat of the electronic substrate 40 can also be transported to outside.

The heat radiating board 34 performs at least one of transporting and radiating the heat conducted via the connection member 33 from the thermal diffusion unit 31. The connection member 33 not only connects the thermal diffusion unit 31 and the heat radiating board 34, but also has the role of thermally connecting the thermal diffusion unit 31 and the heat radiating board 34. The heat conducted from the thermal diffusion unit 31 moves on the heat radiating board 34. The heat, while moving, is radiated to the open air. Thus, a heat radiating board 34 transports and radiates the heat conducted from the thermal diffusion unit 31.

The connection member 33 is directly equipped to the side of the thermal diffusion unit 31, and may be equipped to a extension board extended at least from a part of the side, a front surface, and a rear surface of the thermal diffusion unit 31.

Figure 12:
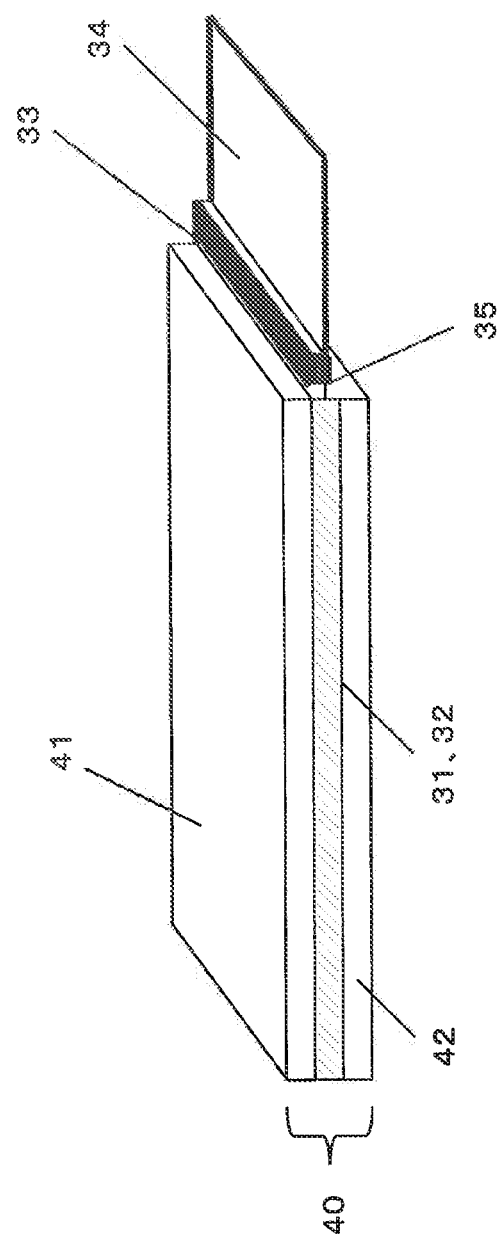
FIG. 12 is another perspective diagram of the electronic substrate of FIG. 10.
Figure 13:
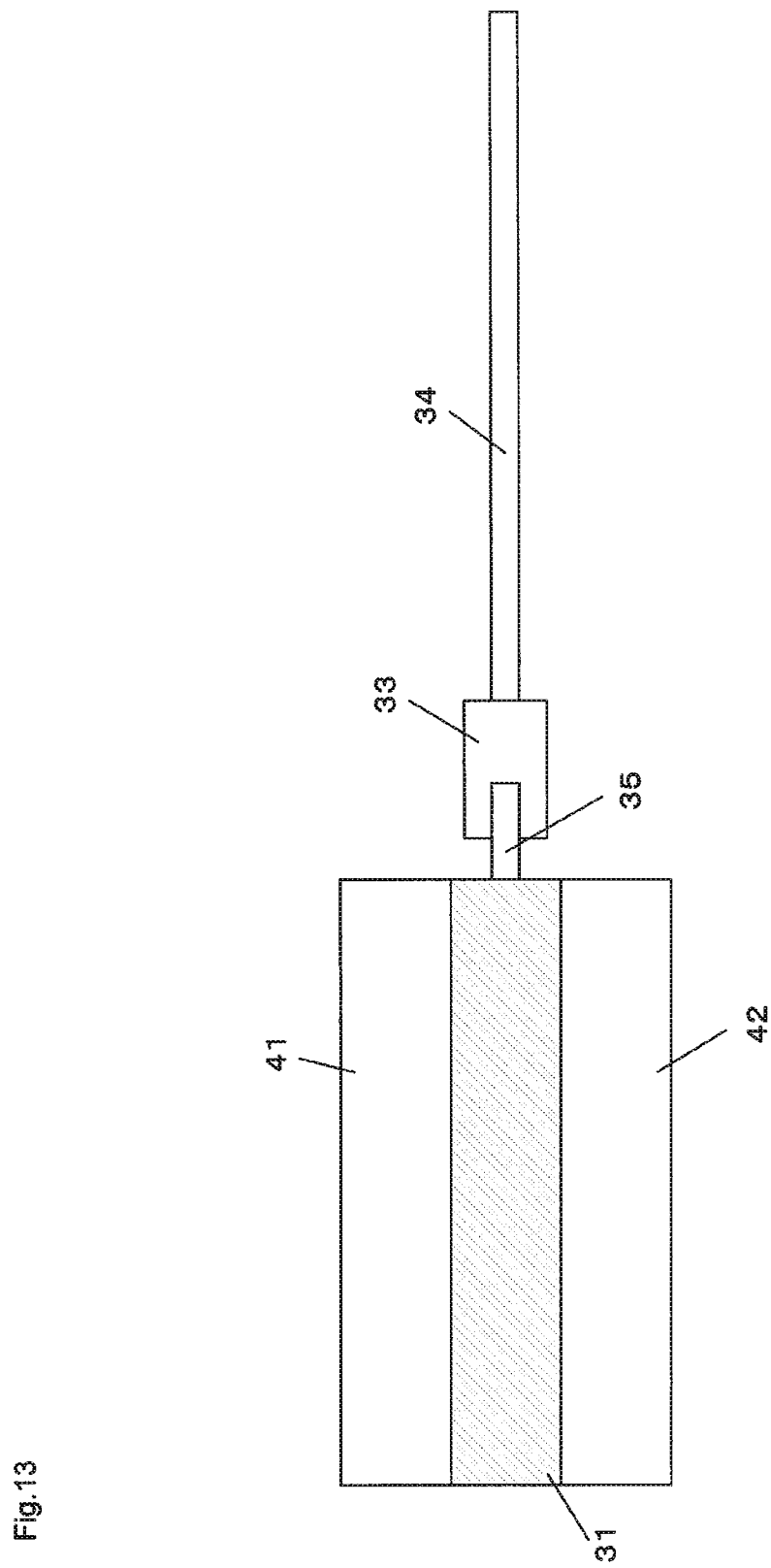
FIG. 13 is another side view of the electronic substrate of FIG. 10.

FIG. 12 and FIG. 13 illustrate a state where the extension board 35 extended from the side of the thermal diffusion unit 31 is being equipped with the connection member 33. FIG. 12 is a perspective diagram of the electronic substrate equipped with the cooling device, and FIG. 13 is a side view of the electronic substrate equipped with the cooling device.

The thermal diffusion unit 31 is further provided with the extension board 35 extending at least from a part of the side, a front surface, and a rear surface of the thermal diffusion unit 31. The extension board 35 may be provided with the thermal diffusion unit 31 by adhering or welding a board member thereto. When the thermal diffusion unit 31 is the heat pipe of a plate-like shape previously explained, the extension board 35 may be formed by making the area of one of the upper plate, the lower plate and the intermediate plates larger than the other board members. In this case, thermal resistance between the thermal diffusion unit 31 and the extension board 35 becomes small, and the heat diffused by the thermal diffusion unit 31 is conducted to the extension board 35 with high efficiency. As a result, heat is efficiently conducted from the extension board 35 to the connection member 33.

The connection member 33 is equipped to the end, the front surface, or the rear face of the extension board 35. Anyway, the connection member 33 thermally contacts with the extension board 35. When the extension board 35 is equipped with the connection member 33 comparing with a case where the side of the thermal diffusion unit 31 is directly equipped with the connection member 33, there is a merit that equipment becomes easy even when an attaching part of the connection member is thin. Alternatively, when the extension boards 35 is a part (one of the upper plate, the lower plate and the intermediate plates when the thermal diffusion unit 31 is the heat pipe previously explained) constituting the thermal diffusion unit 31, heat diffused by the thermal diffusion unit 31 is efficiently conducted to the extension board 35. For this reason, there is a merit that the heat diffused by the thermal diffusion unit 31 is efficiently conducted to the connection member 33.

As mentioned above, the connection member 33 is directly or indirectly via the extension board 35 connected to the thermal diffusion unit 31, and efficient transportation and radiation of heat diffused by the thermal diffusion unit 31 is performed. For example, when the heat radiating board 34 is connected via the connection member 33, the heat radiating board 34 extends to outside of the electronic substrate 40, and the heat radiating board 34 can throw away heat at outside of the electronic substrate 40. Even when influence to electric operation of the electronic substrate 40 may arise caused by radiated heat, the heat radiating board 34 extending even to outside of the electronic substrate 40 can radiate heat at an area that does not affect the electronic substrate 40.

Especially, when the area of the thermal diffusion unit 31 is smaller than those of the circuit boards 41 and 42 (or circuit layers of a multilayer substrate) constituting the electronic substrate 40, the heat radiating board 34 can radiate heat to outside of the electronic substrate 40.

Next, a case where the extension board 35 extends from the thermal diffusion unit 31, and performs at least one of transporting and radiating heat will be explained.

Figure 14:
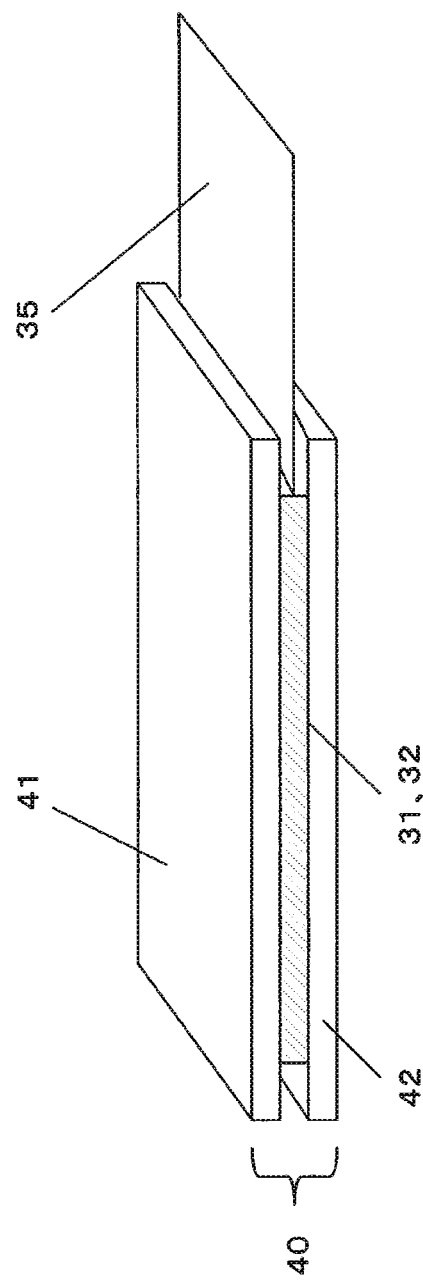
FIG. 14 is another perspective diagram of the electronic substrate of FIG. 10.

FIG. 14 is a perspective diagram of the electronic substrate equipped with the cooling device. A cooling device 30 is provided with the thermal diffusion unit 31. The thermal diffusion unit 31 is provided with the extension board 35 extending at least from a part of the side, the front surface, and the rear face of the thermal diffusion unit 31. The extension board 35 may be constituted by adhering or welding a member constituting the thermal diffusion unit 31, and another member. Alternatively, when the thermal diffusion unit 31 is the heat pipe of a plate-like shape previously explained, the extension board 35 may be formed by enlarging the area of any of the upper plate, the lower plate, and the intermediate plates that constitute the heat pipe than the other board members. In this case, thermal resistance between the thermal diffusion unit 31 and the extension board 35 becomes small, and the heat diffused by the thermal diffusion unit 31 is efficiently conducted to the extension board 35.

Since the extension board 35 is a board member, it performs at least one of transporting and radiating the heat conducted from the thermal diffusion unit 31. Especially, when the extension board 35 is made of material with high thermal conductivity and surface area thereof is large, transporting and radiating the heat can be efficiently performed.

The extension board 35 is also preferably extended even to outside of the electronic substrate 40. For example, as illustrated in FIG. 14, when the area of the thermal diffusion unit 31 is smaller than the areas of the circuit boards 41 and 42, the extension board 35 extends even to outside of the circuit boards 41 and 42. The thermal diffusion unit 31 possesses high capability of diffusing heat. It is, however, sandwiched between the circuit boards 41 and 42, and therefore it is difficult for the thermal diffusion unit 31 to throw away the diffused heat. Even in such a case, the heat diffused by the thermal diffusion unit 31 is radiated by the extension board 35.

The extension board 35 preferably has one of various shapes. In accordance with the shape of the case storing the electronic substrate 40 and an internal structure thereof, the shape of the extension board 35 should be determined.

For example, the extension board 35 may include a bend part and a curved part, and may be bent itself. Bending it enables a part of the extension boards 35 to thermally contact with an internal face of the case, and the extension board 35 can throw away heat via the case contacting there-with.

It is also preferable to further provide the cooling device 30 with a heat radiating unit that radiates heat transported by the extension board 35. The heat radiating unit radiates and cools the heat (of course, while being conducted to the extension board 35, the heat may be radiated) conducted by the extension board 35 to the open air.

The various members possessing a function of causing the heat conducted by the extension board 35 to radiate may be used for the heat radiating unit. For example, the case thermally contacting with the extension board 35, a liquid-cooled jacket taking heat from the extension board 35 to exhaust it, a heat radiating board thermally contacting with the extension board 35, a cooling fan sending wind to the extension board 35, or a heat sink may be used. Such any or the combination thereof may be used as the heat radiating unit.

Figure 15:
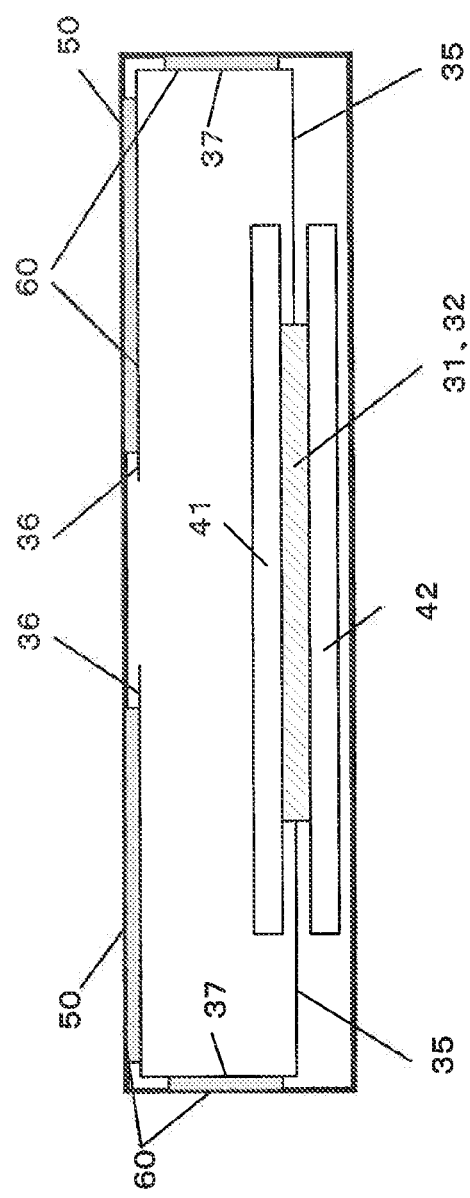
FIG. 15 is an internal perspective diagram of an apparatus equipped with the cooling device shown in FIG. 10.

Referring to FIG. 15, a case will be explained as an example of the heat radiating unit. FIG. 15 is an internal perspective diagram of an apparatus equipped with the cooling device. The apparatus includes a case 50.

The cooling device 30 includes the extension board 35 extending from the side of the thermal diffusion unit 31 (in FIG. 15, from each of the sides opposing to each other). The extension board 35 is bent at two bend portions, and has the shape of a character of substantial "]". The bent extension board 35 includes: the first heat radiating surface 36 thermally contacting with the upper surface of the case 50, and the second heat radiating surface 37 thermally contacting with the side of the case 50. The first heat radiating surface 36 and the second heat radiating surface 37 thermally contact with the case 50 via thermal interface material 60 if needed. The case 50 is a case storing the apparatus and also stores the electronic substrate 40.

In many cases, the case 50 is formed of material with high thermal conductivity, such as metal, alloy, or the like. For this reason, the case 50 can receive heat from the first heat radiating surface 36 and the second heat radiating surface 37 formed on the extension board 35, and can radiate heat to the open air. In particular, the case 50 possesses only a narrow space because of downsizing and thinning the apparatus. When the extension board 35 exists in only such a narrow internal space, it is difficult for the extension board 35 to radiate heat enough. On the contrary, as illustrated in FIG. 15, the cooling device 30 can radiate heat to outside via the case 50, because the first heat radiating surface 36 and the second heat radiating surface 37 are formed on the extension board 35, and thermally contact with the case 50.

Thus, the cooling device 30 can radiate the heat from the thermal diffusion unit 31 to the open air because at least a part of the extension boards 35 thermally contact with the case 50. The extension board 35 does not have to include the first heat radiating surface 36 and the second heat radiating surface 37, and the set of the first heat radiating surface 36 and the second heat radiating surface 37 is a mere example.

Figure 16:
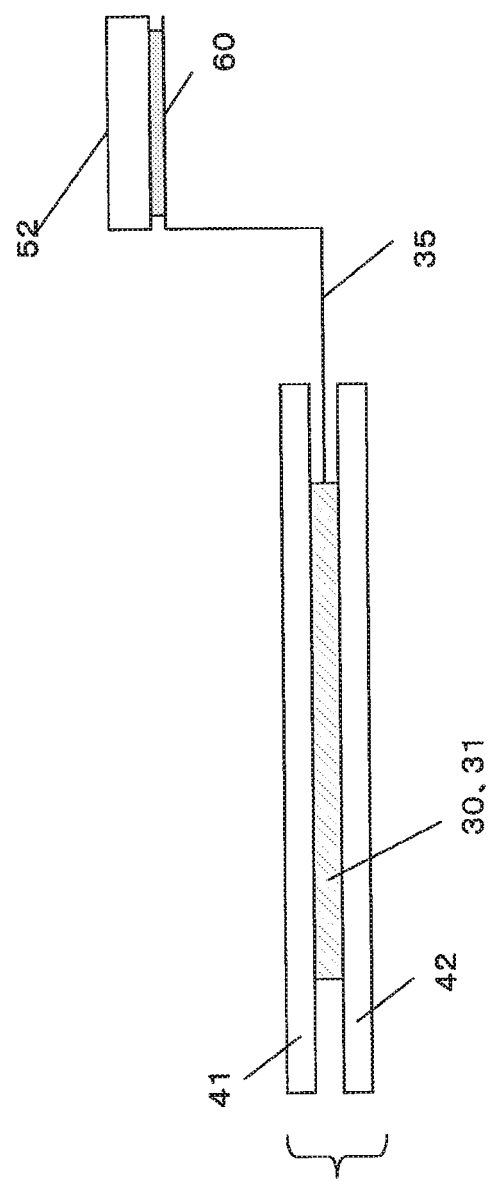
FIG. 16 is another side view of the electronic substrate of FIG. 10.

Next, referring to FIG. 16, a case where the liquid-cooled jacket is an example of the heat radiating unit will be explained. FIG. 16 is a side view of the electronic substrate equipped with the cooling device.

The cooling device 30 includes the extension board 35 extending at least from the part of the side of the thermal diffusion unit 31. In the tip of the extension board 35, a liquid-cooled jacket 52 thermally contacts with the front surface of the extension board 35. A refrigerant circulates through internal of the liquid-cooled jacket 52, thereby taking and exhausting heat. A water pump is an example of the liquid-cooled jacket 52. The liquid-cooled jacket 52 may contact with the extension board 35 via the thermal interface material 60.

The liquid-cooled jacket 52 is used as the heat radiating unit, and the cooling device 30 can efficiently radiate the heat from the thermal diffusion unit 31. As a result, the cooling device 30 can efficiently cool the electronic substrate 40.

Figure 17:
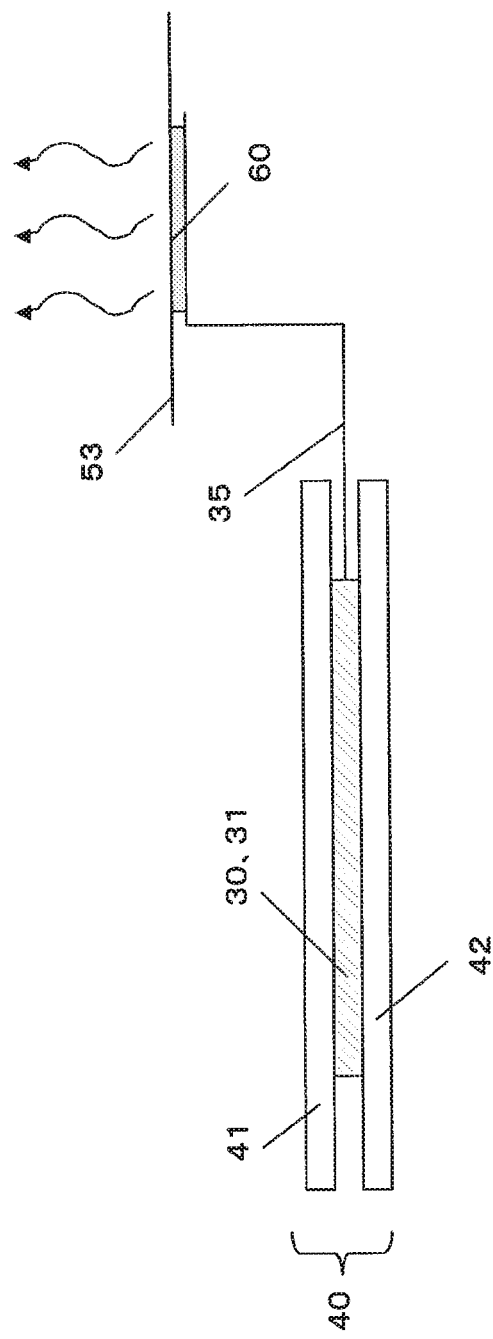
FIG. 17 is another side view of the electronic substrate of FIG. 10.

Next, referring to FIG. 17, a case where a heat radiating board is used as an example of the heat radiating unit will be explained. FIG. 17 is a side view of the electronic substrate equipped with the cooling device.

The cooling device 30 includes the extension board 35 extending at least from a part of a side of the thermal diffusion unit 31. In the tip of the extension board 35, the heat radiating board 53 thermally contacts with the front surface of the extension board 35. As an example of the heat radiating board 53, there is a board member made of metal, resin, and alloy. The heat radiating board 53 may contact with the extension board 35 via the thermal interface material 60. The heat radiating board 53 radiates heat received from the extension board 35 to the open air. As a result, the heat received by the thermal diffusion unit 31 from the heating element is radiated to the open air.

The heat radiating board 53 is used as the heat radiating unit, and the cooling device 30 can efficiently radiate the heat from the thermal diffusion unit 31. As a result, the cooling device 30 can efficiently cool the electronic substrate 40.

Figure 18:
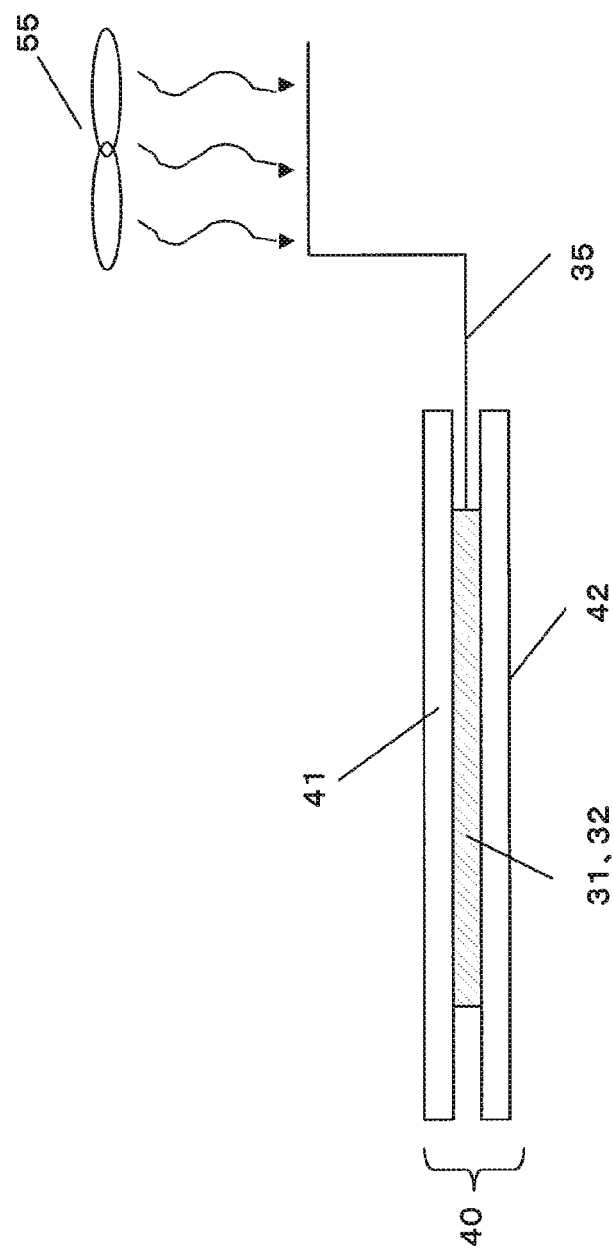
FIG. 18 is another side view of the electronic substrate of FIG. 10.

Next, referring to FIG. 18, a case where a cooling fan is used as an example of the heat radiating unit will be explained. FIG. 18 is a side view of the electronic substrate equipped with the cooling device.

The cooling device 30 includes the extension board 35 extended at least from a part of a side of the thermal diffusion unit 31. The cooling device 30 is provided with a cooling fan 55 that sends wind to the front surface of the extension board 35. The cooling fan 55 sends wind to at least a part of the front surface of the extension board 35 (of course, it may send wind to at least a part of the rear face thereof. In short, it is enough for the cooling fan 55 to able to send wind to the extension board 35). When the cooling fan 55 sends wind, then the heat conducted by the extension board 35 is radiated. That is, the cooling fan 55 can radiate the heat conducted from the thermal diffusion unit 31 to the extension board 35. As a result, the heat received by the thermal diffusion unit 31 from the electronic substrate 40 is radiated to the open air.

Thus, the cooling device 30 can efficiently cool the electronic substrate 40 because the cooling device 30 includes the cooling fan 55 that sends wind to the extension board 35.

Figure 19:
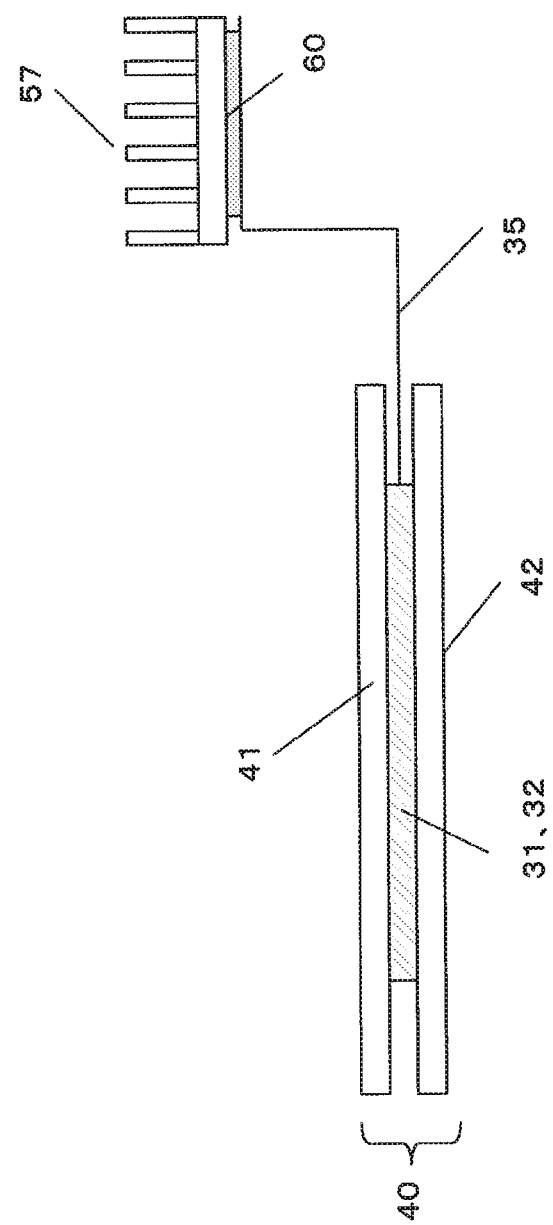
FIG. 19 is another side view of the electronic substrate of FIG. 10.

Next, referring to FIG. 19, a case where a heat sink is used as an example of the heat radiating unit will be explained. FIG. 19 is a side view of the electronic substrate equipped with the cooling device.

The cooling device 30 includes the extension board 35 extending from at least a part of a side of the thermal diffusion unit 31. The cooling device 30 is provided with a heat sink 57 that thermally contacts with the tip of the extension board 35. The heat sink 57 includes a base, and fins erecting from the base. The heat sink 57 thermally contacts the extension board 35 via the thermal interface material 60 if needed. The heat sink 57 takes heat from the extension board 35, and radiates the heat to the open air through the fins.

Thus, the cooling device 30 can efficiently cool the electronic substrate 40 because the cooling device 30 is provided with the heat sink 57 that thermally contacts with the extension board 35.

The extension boards 35 illustrated in FIG. 15 to FIG. 19 may be constituted integrally with the thermal diffusion unit 31, or may be constituted independently there-from. When constituted independently there-from, the side of the thermal diffusion unit 31 is equipped with the extension board 35.

Thus, the extension board 35 extends from the thermal diffusion unit 31 to outside of the electronic substrate 40, and at least one of various thermal diffusion units is provided to the extending extension board 35. Thereby, heat taken by the thermal diffusion unit 31 from the electronic substrate 40 is efficiently radiated at outside of the electronic substrate 40.

When the extension board 35 is constituted independently from the side of the thermal diffusion unit 31, the extension board 35 may possess a structure that the attaching part is provided to at least a part of the side of the thermal diffusion unit 31.

Figure 20:
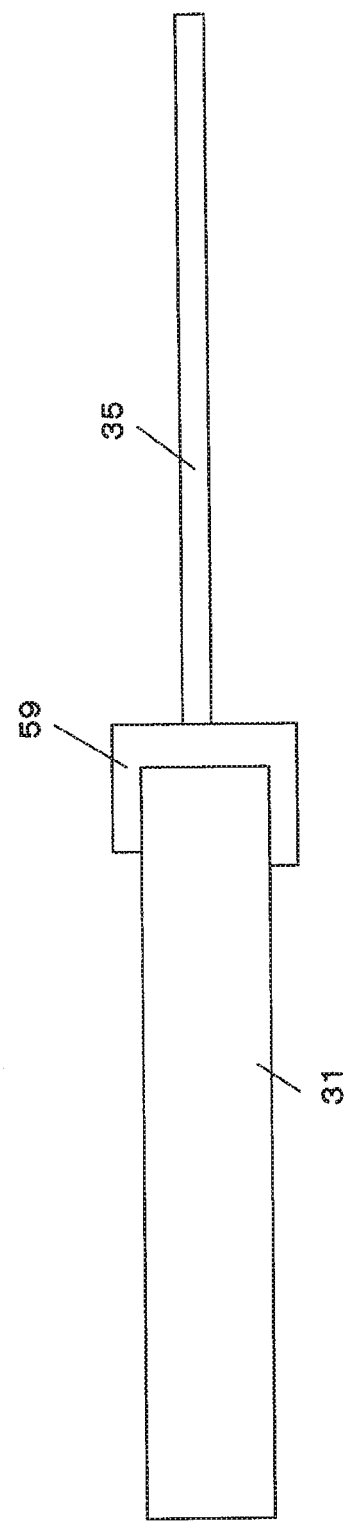
FIG. 20 is a side view of an extension board according to the Present Disclosure.

FIG. 20 is a side view of the extension board.

The extension board 35 includes an attaching part 59, and the side of the thermal diffusion unit 31 is equipped with this attaching part 59. Providing the side of the thermal diffusion unit 31 with the attaching part 59 enables the extension board 35 to be attached to the side of the thermal diffusion unit 31.

As mentioned above, the cooling device can throw away the heat taken from the electronic substrate to outside of the electronic substrate. As a result, the cooling device can efficiently cool the electronic substrate, and the heating element mounted there-on.

Additionally, the cooling device may represent a structure that the thermal diffusion unit includes a via-hole electrically connecting the first circuit mounting front surface and the second circuit mounting surface, which sandwich a thermal diffusion unit there-between, is explained.

The thermal diffusion unit thermally contacts with the first circuit mounting surface and the second circuit mounting surface. When the electronic substrate includes a plurality of circuit boards, the first circuit mounting surface and the second circuit mounting surface are circuit mounting surfaces of the plurality of circuit boards. When the electronic substrate is a multilayer substrate, the first circuit mounting surface and the second circuit mounting surface are circuit layers included in the multilayer substrate.

For this reason, the via-hole may electrically connect a set of circuit boards sandwiching the thermal diffusion unit there-between, and may electrically connect a set of circuit layers sandwiching the thermal diffusion unit there-between. Connecting the circuit boards and the circuit layers that sandwich the thermal diffusion unit causes also connecting circuit boards and circuit layers other than the set of circuit boards and the set of circuit layers being connected thereto.

Figure 21:
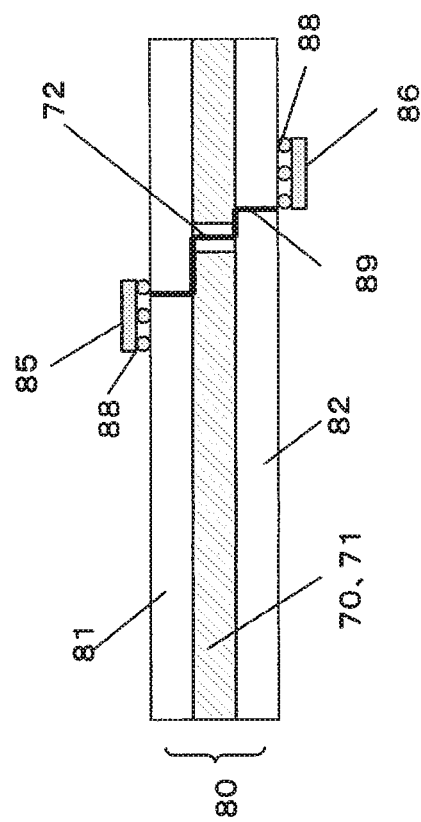
FIG. 21 is a side view of an electronic substrate equipped with a cooling device according to the Present Disclosure.

In FIG. 21, an electronic substrate 80 including a first circuit mounting surface 81 and a second circuit mounting surface 82 is illustrated. A thermal diffusion unit 71 is sandwiched between the first circuit mounting surface 81 and the second circuit mounting surface 82. Herein, the electronic substrate 80 may include a plurality of circuit boards, and may be a multilayer substrate.

As previously explained, the thermal diffusion unit 71 may be a board member formed of metal, alloy, resin, or the like, or may be a heat pipe of a plate-like shape. In a case of the heat pipe of the plate-like shape, the upper plate, the lower plate, and intermediate plates may be laminated to form the heat pipe.

The thermal diffusion unit 71 includes a via-hole 72. The via-hole 72 penetrates the thermal diffusion unit 71 from the front surface to the rear face thereof. An electronic part 85 and an electronic part 86 are mounted on each of the first circuit mounting surface 81 and the second circuit mounting surface 82, respectively. In some cases, the electronic part 85 and the electronic part 86 should be electrically connected. The electronic part 85 is mounted on the first circuit mounting surface 81, and the electronic part 86 is mounted on the second circuit mounting surface 82 (in addition, faces of the first circuit mounting surface 81 and the second circuit mounting surface 82 include a first face directly contacting with the thermal diffusion unit 71, and a second face opposing to the first face).

There is the thermal diffusion unit 71 between the first circuit mounting surface 81 and the second circuit mounting surface 82. The electronic part 85 and the electronic part 86 are not electrically connectable as it is. This explanation is being performed with the electronic part 85 and the electronic part 86. Each of the first circuit mounting surface 81 and the second circuit mounting surface 86 operate according to electronic signals, therefore electric connection between the first circuit mounting surface 81 and the second circuit mounting surface 82 is required in some cases. Also in these cases, the thermal diffusion unit 71 causes obstructions, and the electrical connection between the first circuit mounting surface 81 and the second circuit mounting surface 82 is not able.

Thus, in some cases, the cooling device that can simultaneously and flexibly cool the first circuit mounting surface and the second circuit mounting surface may disturb the electrical connection between the first circuit mounting surface and the second circuit mounting surface.

In the cooling device 70 illustrated in FIG. 21, a via-hole 72 is opened in the thermal diffusion unit 71, thereby enabling to electrically connect the first circuit mounting surface 81 and the second circuit mounting surface 82. The via-hole 72 penetrates the thermal diffusion unit 71 from the front surface to the rear face thereof, and the first circuit mounting surface 81 and the second circuit mounting surface 82 can be electrically connected to each other. For example, electric conduction lines (leads, copper wires, or the like) extending from the first circuit mounting surface 81 may reach the second circuit mounting surface 82 through the via-hole 72. These electric conduction lines can connect electronic parts on the first circuit mounting surface 81, and electronic parts of the second circuit mounting surface 82.

Alternatively, in the first circuit mounting surface 81 and the second circuit mounting surface 82, an electronic part mounted on a face that does not contact with the thermal diffusion unit 71 may be connected. FIG. 21 illustrates such a structure.

In the first circuit mounting surface 81, an electronic part 85 is mounted on a face that does not contact with the thermal diffusion unit 71. Similarly, in the second circuit mounting surface 82, an electronic part 86 is mounted on a face that does not contact with the thermal diffusion unit 71. The electronic part 85 and the electronic part 86 include ball grid arrays (hereinafter "BGAs"), and electrical connection to a circuit board or a circuit layer is made using these BGAs. The electronic part 85 can extend an electric conduction line 89 to the thermal diffusion unit 71 through the via-hole of a circuit board or a circuit layer of the first circuit mounting surface 81. The electric conduction line 89 can reach the second circuit mounting surface 82 through the via-hole 72. A circuit board or a circuit layer of the second circuit mounting surface 82 includes the via-hole, and the electric conduction line 89 is connectable to the electronic part 86.

As mentioned above, the electronic-part 85 and the electronic-part 86 that are mounted on a face that does not contact with the thermal diffusion unit 71 are also electrically connected using the via-hole 72 of the thermal diffusion unit 71.

The via-hole 72 not only may allow electric conduction lines to pass through but also may be covered by electric conduction film in the internal thereof, thereby electrically connecting the first circuit mounting surface 81 and the second circuit mounting surface 82 using this electric conduction film. It is also preferable to cover the internal of the via-hole 72 with the electric conduction film, thereby electrically connecting circuit patterns formed on each of the first circuit mounting surface 81 and the second circuit mounting surface 82, respectively.

Figure 22:
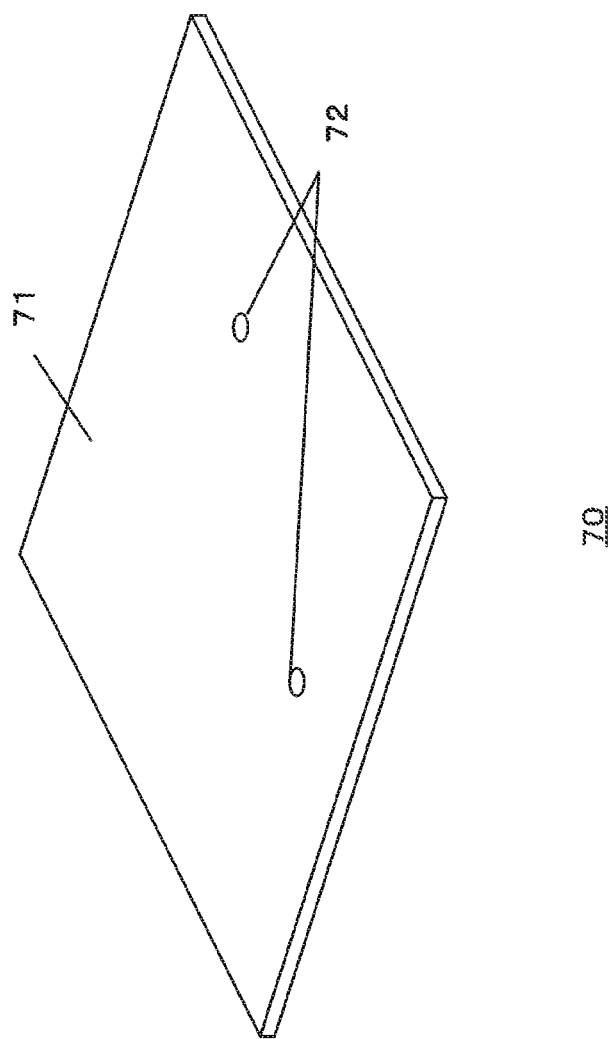
FIG. 22 is a perspective diagram of a heat pipe according to the Present Disclosure.

As illustrated in FIG. 22, the thermal diffusion unit 71 may be provided with a plurality of via-holes 72. FIG. 22 is a perspective diagram of the heat pipe.

When the thermal diffusion unit 71 previously explained is a heat pipe, through holes may be beforehand opened in each of members constituting the heat pipe, and the members are laminated, thereby forming the via-hole with the through holes. In this case, a very minute via-hole can be formed.

Figure 23:
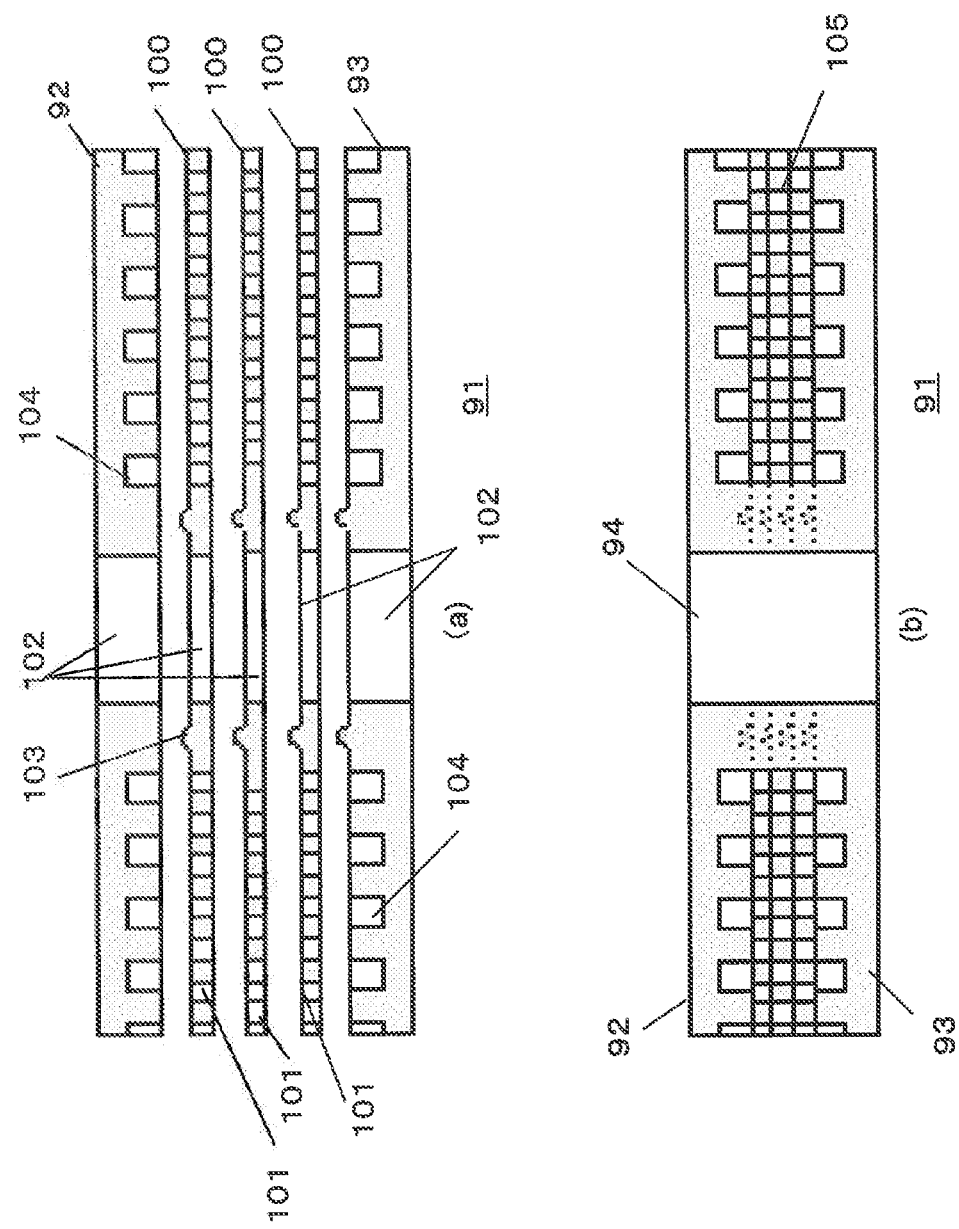
FIG. 23 is a mimetic diagram of the heat pipe of FIG. 22.

An example of forming the via-hole in a heat pipe is illustrated in FIG. 23. FIG. 23 is a mimetic diagram of the heat pipe. FIG. 23(a) illustrates a state where each of members is divided at the time of manufacture, and FIG. 23(b) illustrates a state where the members are sealed and the heat pipe 91 is completed.

A heat pipe 91 is provided with a plate-like upper plate 92, a plate-like lower plate 93, and a plurality of plate-like intermediate plates 100.

The lower plate 93 opposes to the upper plate 92, and the shape and size thereof are preferably the almost same as those of the upper plate 92. Of course, even not the same, it is included in the aspect of the Present Disclosure.

Each of the plurality of intermediate plates 100 is laminated between the upper plate 92 and the lower plate 93. Each of the plurality of intermediate plates 100 includes an internal through hole 101. When the plurality of intermediate plates 100 are laminated, only a part of internal through hole 101 overlaps, and a capillary channel 105 possessing a cross-section area smaller than the cross-section area of the internal through hole 101 itself is formed. The capillary channel 105 becomes a passage where the condensed refrigerant circulates.

Each of the upper plate 92, the lower plate 93, and the plurality of intermediate plates 100 include an external through hole 102. When all of the upper plate 92, the lower plate 93, and the plurality of intermediate plates 100 are laminated, these external through holes 102 overlap in the same position to form a via-hole 94. The via-hole 94 penetrates the upper plate 92 until the lower plate 93, and the upper surface and the bottom face of the heat pipe 91 can be electrically connected. That is, the via-hole 94 can connect electrically the first circuit mounting surface and the second circuit mounting surface. Of course, the via-hole 94 can electrically connect electronic parts and circuit patterns that are mounted on the upper surface and the bottom face of the heat pipe 91.

The external through hole 102 is not formed after the heat pipe 91 has been constituted, but is beforehand formed in every member laminated (each of the upper plate 92, the lower plate 93, and the plurality of intermediate plates 100).

When forming a through hole in a board-like member, there is a processing limit where neither deformation of through-hole neighborhood formed nor a crack is made. When forming the through hole, assuming that t is given as thickness of the board-like member, and phi is given as the diameter of the through hole:

$$(1/2)*t<=d \tag{Formula 1}$$

The above processing limit is settled. That is, in order to form a smaller through hole, it is necessary to make thickness of the board-like member thinner. It is necessary to enlarge the diameter of the through hole as it is expressed with Formula 1, when the thickness of a member is larger. This is because it is necessary to make considerable pressure to concentrate within a small area when processing in order to make the diameter of the through hole smaller, and influence on the through-hole neighborhood can become larger.

On the other hand, when forming the via-hole 94 in the heat pipe 91, the smaller diameter of the via-hole 94 is preferable for preventing performance-deterioration of the heat pipe 91 and for convenience on use.

However, since there is a processing limit expressed with Formula 1, if the via-hole 94 is formed after the heat pipe 91 has been constituted; the diameter of the via-hole 94 surely becomes larger. This is because the diameter of the via-hole 94 depends on the thickness of the heat pipe 91 no matter how thin is the heat pipe 91 is.

On the contrary, when the external through hole 102 is formed for every member, the diameter of the via-hole 94 can be made smaller. The heat-pipe 91 must possess the fixed thickness. Each of members to be laminated, however, can be made considerably thinner than the thickness of heat-pipe 91 itself. For this reason, the diameter of the external through hole 102 provided for every member can be made smaller.

Each of the upper plate 92, the lower plate 93, and the plurality of intermediate plates 100 is laminated to constitute the heat pipe 91 of FIG. 23. At this time, the external through-holes 102 respectively provided in the upper plate 92, the lower plate 93, and the plurality of intermediate plates 100 overlap in the same position, thereby forming the via-hole 94 penetrating the upper plate 92 until the lower plate 93. As a result, the via-hole 94 has a first diameter not greater than a second diameter defined by the processing limit (processing limit expressed by Formula 1) based on the thickness of the heat pipe 91. The first diameter is greater than a third diameter defined by the processing limit (processing limit expressed by Formula 1) based on the thickness of every member.

The via-hole 94 has such a small diameter that does not exceed the processing limit. As a result, without causing problems in processing and manufacture, the via-hole 94 capable of preventing performance-deterioration of the heat pipe 91 and convenience on use can be formed.

For example, considering Formula 1, when the diameter □d of the via-hole 94 should be 2 [mm], the thickness of a member to be opened the via-hole 94 should be less than 4 [mm]. When the via-hole 94 is directly formed in the heat pipe 91, the thickness of the heat pipe 91 should be not greater than 4 [mm], which is considerably difficult.

On the other hand, when the external through hole 102 is formed for every member, the thickness of every member should be not greater than 4 [mm] in order to open a via-hole of a 2 [mm] diameter, which is very easy.

If the thickness of the heat pipe 91 is 4 [mm], the thickness of the upper plate 92, the lower plate 93, and the intermediate plates 100 (assuming the plurality of intermediate plates 100 is two plates) is about 1 [mm], respectively. When the thickness of each plate is 1 [mm], the diameter □d of the external through hole 102 can be made to smaller, that is, 0.5 [mm]. The via-hole 94 is formed by overlapping external through-holes 102. For this reason, the diameter of the via-hole 94 is 0.5 [mm].

Thus, comparing with the processing limit of 2 [mm], the diameter of the via-hole 94 of the heat pipe 91 illustrated in FIG. 23 is significantly improved, that is 0.5 [mm]. In short, the via-hole 94 becomes very minute.

When the diameter of the via-hole 94 becomes very minute, resistance in electrical connection between the first circuit mounting surface and the second circuit mounting surface also becomes small, and operating precision of the electronic substrate of operation is improved.

As mentioned above with the cooling device, the circuit board and circuit layers sandwiching the thermal diffusion unit there-between can be electrically connected without depending on leading electrical conduction lines. As a result, utility value of the electronic substrate or the cooling device increases.

Figure 24:
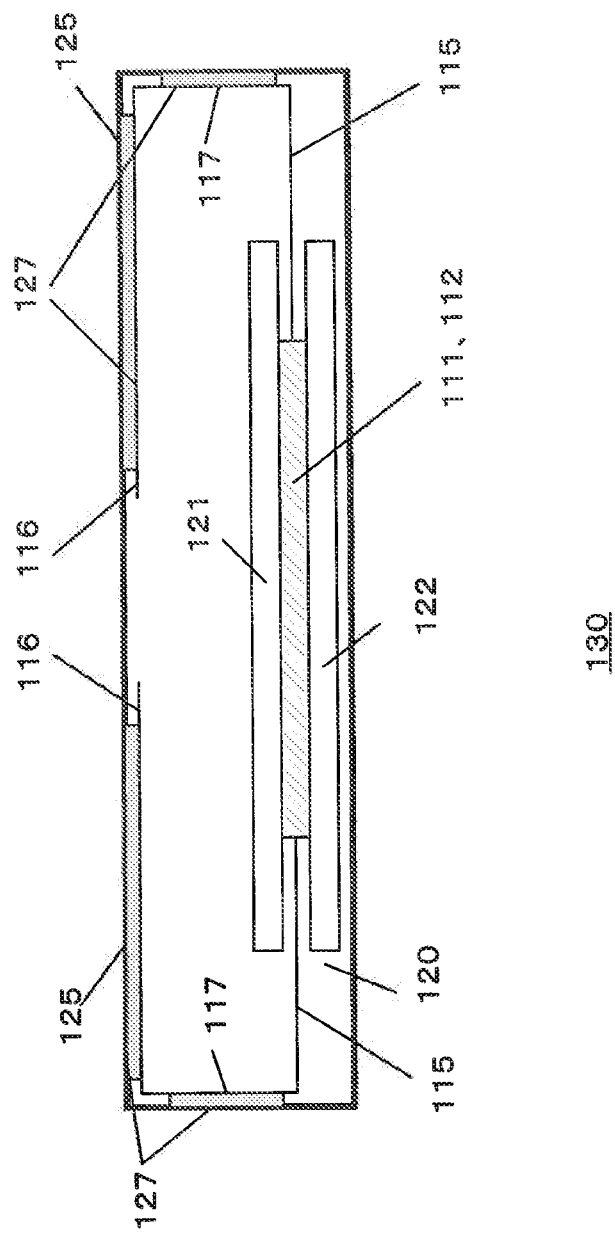
FIG. 24 is an internal perspective diagram of an electronic device according to the Present Disclosure.

Additionally, an electronic substrate may be equipped with the cooling device, and an electronic device using the electronic substrate will be explained. FIG. 24 is an internal perspective diagram of the electronic device.

An electronic device 130 is provided with an electronic substrate 120, and a case 125 storing the substrate. The electronic device 130 supplies various operation according to functions with which the electronic substrate 120 is provided. The electronic substrate 120 is equipped with a cooling device 111. The electronic substrate 120 includes a plurality of circuit boards 121 and 122. The electronic substrate 120 may be a multilayer substrate that includes a plurality of circuit layers.

The circuit board 121 and the circuit board 122 included in the electronic substrate 120 sandwich a thermal diffusion unit 112 there-between. The thermal diffusion unit 112 receives heat from the circuit board 121 and the circuit board 122, diffuses the heat, and conducts the heat to an extension board 115. The extension board 115 is bent and is provided with a first heat radiating surface 116 and a second heat radiating surface 117. The first heat radiating surface 116 and the second heat radiating surface 117 thermally contact with a case 125, and radiate heat from the case 125 to the open air. At this time, the first heat radiating surface 116 and the second heat radiating surface 117 may thermally contact with the case 125 via thermal junction goods 127.

The electronic substrate 120 can cool the circuit board 121 and the circuit board 122 using the cooling device 111 in this way. At this time, with the cooling device 111, the circuit board 121 and the circuit board 122 can be simultaneously or individually cooled. Since the cooling device 111 is sandwiched between the circuit board 121 and the circuit board 122, the circuit board 121 and the circuit board 122 are flexibly cooled with the cooling device 111. Malfunction and fault operation cased by heat generation is hard to occur when refrigerating the electronic substrate 120.

Thus, the electronic device 130 mounted the electronic substrate 120 equipped with the cooling device 111 can prevent troubles caused by too much heat generation of electronic parts or electronic substrates. Such an electronic device 130 is applied to the apparatus of various uses.

For example, as an example of the electronic device 130, there are a notebook personal computer, a desktop personal computer, server equipment, a personal digital assistant, a cell phones, a car-mounted electronic terminal, or the like.

Figure 25:
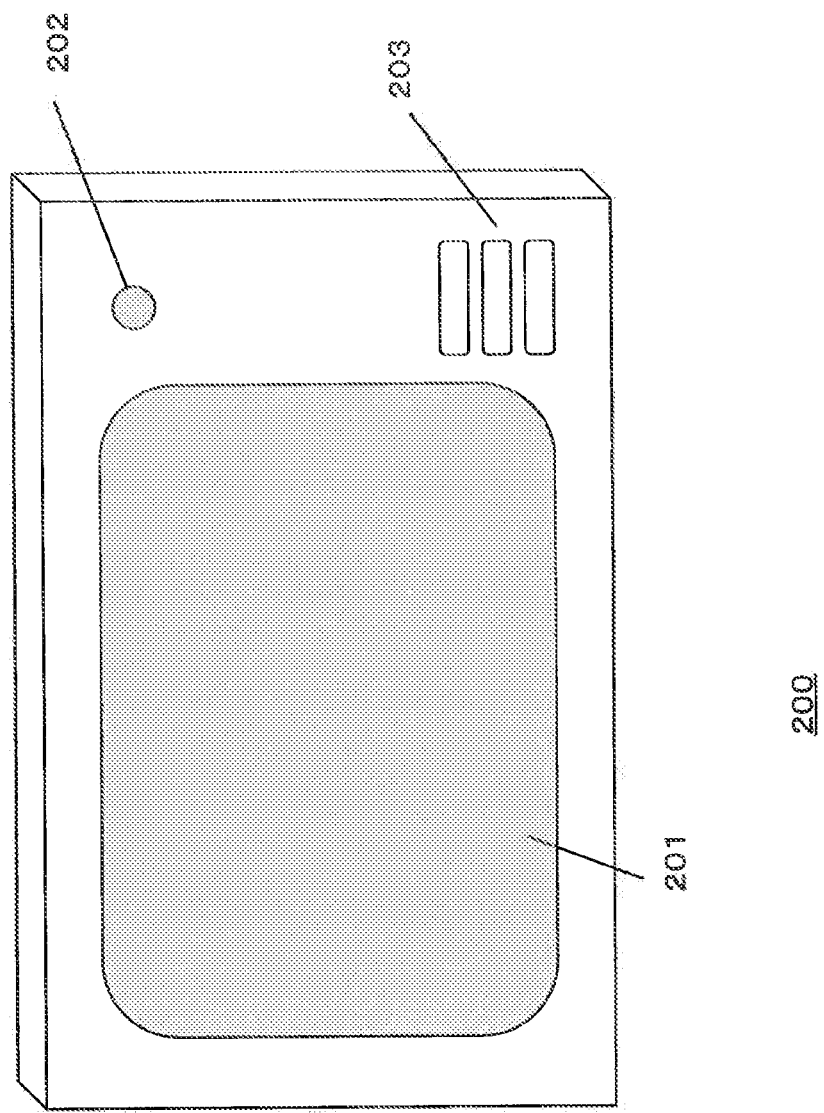
FIG. 25 is a perspective diagram of the electronic device of FIG. 25.

An example of the electronic device is illustrated in FIG. 25. FIG. 25 is a perspective diagram of the electronic device. An electronic device 200 is an electronic device that downsizing and thinning thereof is required, such as a car-mounted television set, a personal monitor, or the like.

The electronic device 200 is provided with a display 201, a light-emitting element 202, and a speaker 203. The electronic substrate 120 equipped with the cooling device 111 is stored in inside of this electronic device 200.

Since the cooling device 111 is stored in inside of the electronic device 200, the cooling device 111 can cool the electronic substrate and the heating element, without disturbing downsizing and thinning the electronic device. As a result, malfunction and fault operation of the electronic device 200 can be prevented.

Considering like the above, the cooling device 111 can be preferably replaced with: a heat-radiating fin and a liquid-cooled device mounted on a notebook personal computer, a personal digital assistant, a computer terminal, or the like; a heat-radiating frame and a cooling device mounted on a light, an engine, a control computing part of a automobile and industrial equipment; or the like. As a result, the cooling device 111, the electronic substrate 120 equipped with the cooling device 111 can be applicable to a wide range (an electronic device, industrial equipment, an automobile, an airplane, transport machine, or the like).

The cooling device and the electronic substrate can be suitably used for a computer or server equipment provided with many electronic substrates.

Figure 26:
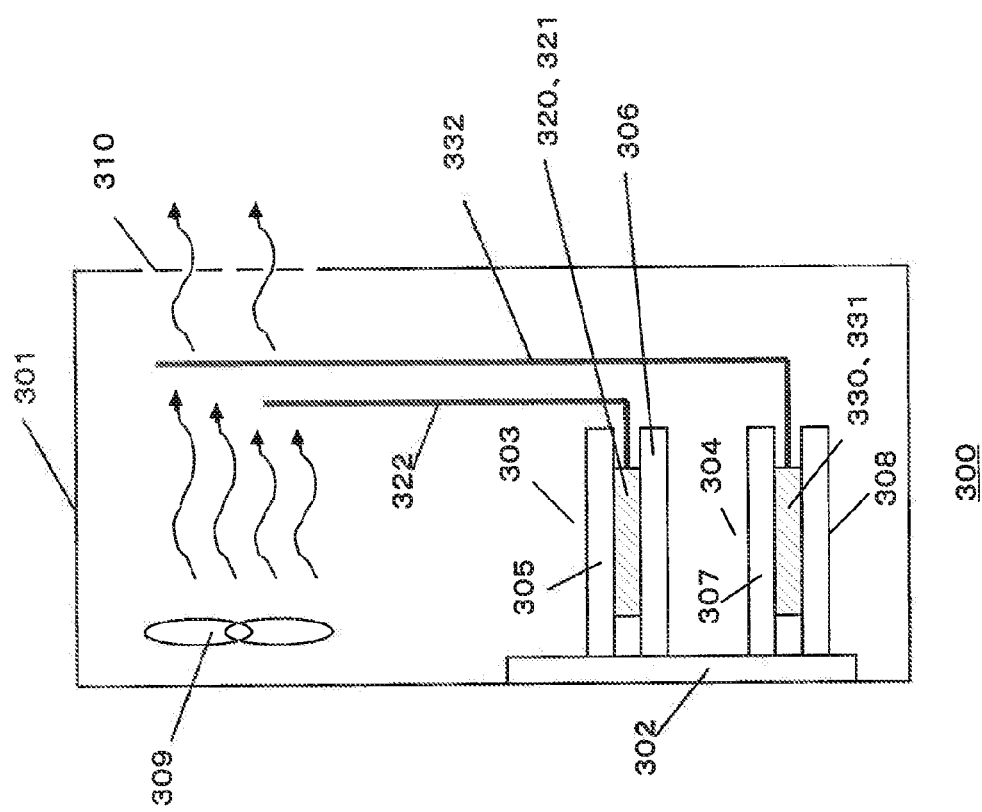
FIG. 26 is an internal perspective diagram of server equipment according to the Present Disclosure.

FIG. 26 is an internal perspective diagram of the server equipment. FIG. 26 illustrates an example that the cooling device and the electronic substrate are applied to inside of a server of an example of the electronic device.

The server equipment 300 is provided with a case 301, and the case 301 is provided with a slot 302 through which an electronic substrate is inserted into inside of the case 301. A plurality of electronic substrates 303 and 304 are inserted in the slot 302.

The electronic substrate 303 is provided with circuit boards 305 and 306, and a thermal diffusion unit 321 is equipped between the circuit board 305 and the circuit board 306. The thermal diffusion unit 321 is included in a cooling device 320.

Similarly, the electronic substrate 304 is provided with the circuit boards 307 and 308, and a thermal diffusion unit 331 is equipped between the circuit board 307 and the circuit board 308. The thermal diffusion unit 331 is included in a cooling device 330. Herein, only a case of two electronic substrates is illustrated. When each of circuit boards is regarded as an electronic substrate, it is thought that four electronic substrates are inserted in the slot 302.

That is, the cooling device may be mounted on every set of two electronic substrates among a plurality of electronic substrates inserted in the slot 302.

In FIG. 26, two cooling devices 320 and 330 are illustrated. As the cooling device, one cooling device as a whole may be provided with a plurality of thermal diffusion units.

An upper part of the case 301 is equipped with a cooling fan 309, and the case 301 is provided with an exhaust port 310 according to a direction of wind sent by the cooling fan 309.

Each of the thermal diffusion units 321 and 331 is provided with extension boards 322 and 332, and each of the extension boards 322 and 332 is bent and extends up to a position where receives the wind from the cooling fan 309. Each of the extension boards 322 and 332 can receive the wind from the cooling fan 309, and can radiate heat. The radiated heat is exhausted from an exhaust port 310 to outside of the case 301. Such a structure of the server 300 can suppress heat generation in inside of the server equipment 300 not greater than a fixed level.

Especially, in many cases, many electronic substrates are mounted on the server equipment 300. The server equipment 300 operates for 24 hours (all the day), inside of which tends to hit high temperature.

As illustrated in FIG. 26, when each of electronic substrates is equipped with the cooling device, heat generation of the server equipment 300 is suppressed, and malfunction and fault operation can be prevented.

Thus, since the cooling device is sandwiched between a plurality of electronic substrates and equipped, the cooling device is preferably applied to server equipment and a computer that regularly store a lot of electronic substrates.

Figure 27:
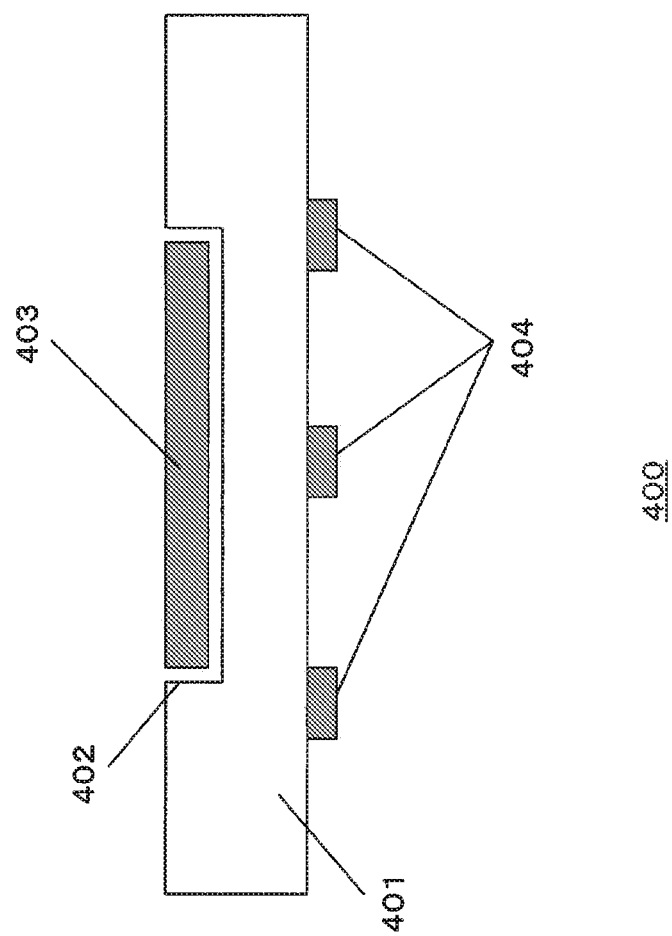
FIG. 27 is a side view of the cooling device shown in FIG. 26.

Additionally, the thermal diffusion unit may be attached to the recess part of the electronic board is explained. FIG. 27 is the side-view of the cooling device. FIG. 27 shows the cross-section of the side-view in the mid-stream.

Cooling device 400 includes electronic board 401 that includes the recess part 402 and the thermal diffusing unit 403 that is attached to the recess part 402, and at least a part of front surface, rear surface and side of the thermal diffusing unit 403 thermally contacts at least a part of front surface and side to the recess part 402.

The electronic board 401 mounts the heating element 404. The heating element 404 comprises electronic parts, semiconductor integrated circuits, electron elements, etc. that are mounted on the electronic board 401.

The electronic board 401 can be mounted on various electronic devices and thus it possesses shapes and sizes that are dependent on the shapes and the configuration of electronic devices. In such electronic boards, recess part 402 can be laid on their front surface. This is caused because a part of multi-layer substrate is removed or the board is reshaped to meet the shape of the electronic device. There are cases where the heat of the electronic board 401 needs cooling, yet projection of the cooling device outside the electronic board 401 must be avoided. In such cases, a recess part 401 is created so that the thermal diffusing unit 403 is inserted in this recess part 401 to avoid having the thermal diffusing unit 403 (that is, cooling device) protrude from the font surface of the electronic board 401.

Based upon the above mentioned reason, the electronic board 401 provides the recess part 402.

The electronic board 401 mounts the heating element 404 on the opposing surface from the recess part 402. The heat generated by the heating element 404 can affect the surrounding electronic parts and electronic board 401 itself, or it can also affect its own operation. However, mounting the thermal diffusing unit 403 on the surface of heating element 404 will protrude the electronic board 401, which will make it difficult to mount the electronic board 401 inside the electronic device. Yet, the heat generated by the heating element 404 conducts within the electronic board 401, which often heats the electronic board 401 to high temperature.

The cooling device 400 shown in FIG. 27 inserts the thermal diffusion unit 403 in the recess part 402. The thermal diffusion unit 403 thermally contacts at least a part of the front surface and the side of recess part 402 to take heat away from the electronic board 401 (and consequently from the heating element 404). The thermal diffusion unit 403 encloses refrigerant in the internal space. The thermal diffusion unit 403 cools the heat from the recess part 402 by diffusing the refrigerant evaporated by the heat conducted away from the recess part 403, and by circulating the cooled and condensed refrigerant.

The thermal diffusion unit 403 will not protrude from the electronic board 401 since it will be inserted in the recess part 402. Thus, the electronic board 401 will be cooled by the thermal diffusing unit 403 as well as cause no trouble in mounting on electronic devices.

Additionally, installing the thermal diffusing unit 403 in the recess part 402 will generate the advantage that the thermal diffusing unit 403 either two- or three-dimensionally takes heat away from the electronic board as well as the advantage that it will avoid the projection of the electronic board 401. The thermal diffusing part 403 is able to thermally contact the front surface and the side of the recess part 402. Thus, the thermal diffusion unit 403 can take heat away from the electronic board 401 using both the rear surface and the side of the thermal diffusion unit 403.

Consequently, by installing the thermal diffusion unit 403 in the recess part 402, the electronic board is more efficiently cooled. The thermal diffusing part 403 diffuses heat in either radial or lineal fashion.

The thermal diffusion unit 403 herein holds the heat pipe architecture shown in FIG. 6 sited as an example. This means that the thermal diffusion unit 403 equips the upper plate, lower plate that opposes the upper plate, and one or more number of intermediate plates that are laminated in between the upper and lower plates. An internal space is formed by the upper plate and the lower plate, and vaporization and condensation of the refrigerant sealed in the area will diffuse the heat received from the heating element. The intermediate plates include a notched part and an internal through hole. The notched part forms a vapor diffusion path that diffuses vaporized refrigerant and the internal through hole forms a capillary that circulates condensed refrigerant.

FIG. 6 describes the heat pipe that holds the architecture explained hereinabove. An upper plate 20 is a plate-like shape, and possesses the predetermined shape and area. Although the upper plate 20 is formed of metal, resin, or the like, it is preferably formed of metal with high thermal conductivity, such as copper, aluminum, silver, aluminum alloy, iron, iron alloy, and stainless steel, or rust-free (high durability) metal. The upper plate 20 may be of one of various shapes, such as a rectangle, a lozenge, a circle, an ellipse, and a polygon. The rectangle is tends to be adapted considering ease of manufacturing and mounting thereof.

It is preferable that a recess part 24 communicating with at least one of the vapor diffusion path 25 and the capillary channel 26 is provided with a surface of the upper plate 20. The condensed refrigerant is easily conducted from the upper plate 20 to the capillary channel 26 when the recess part 24 communicates with the capillary channel 26. Alternatively, the vaporized refrigerant easily contacts with the heat radiating surface within a wide area, thereby promoting heat radiation of the evaporated refrigerant, when the recess part 24 communicates with the vapor diffusion path 25. Furthermore, the vaporized refrigerant can move to the recess part 24 to spread also in the thickness direction when the recess part 24 communicates with the vapor diffusion path 25. As a result, the heat pipe 18 diffuses the received heat in plane and thickness directions.

When the thermal diffusion unit 2 is horizontally arranged to the earth surface, the plane direction is horizontal to the earth surface, and the thickness direction is perpendicular to the earth surface. When the thermal diffusion unit 2 is on a tilt or vertically arranged to the earth surface, the plane direction is a plane direction of the thermal diffusion unit 2 of a plate-like shape, and the thickness direction is the thickness direction of the thermal diffusion unit 2 of the plate-like shape.

It is also suitable for the upper plate 20 to provide with a projection joined to the intermediate plates 22 and an adhesion part. For convenience, the upper plate 20 is called as "upper", however, the plate does not need to be a upside position physically, and does not need to be distinguished from the lower plate 21 specifically. Moreover, there is no specific problem whether the upper plate 20 is near to the heat radiating surface or the heat receiving surface.

Moreover, the upper plate 20 is provided with an injection port 27 of the refrigerant. When the upper plate 20, the intermediate plates 22, and the lower plate 21 are laminated and connected, an internal space will be formed. Since the internal space needs to seal the refrigerant, the refrigerant is entered from the injection port 27 after connection of the upper plate 20 or the like. When the refrigerant is entered, the injection port 27 is sealed. Then, the internal space is sealed.

The refrigerant may be sealed from the injection port 27 after lamination and the refrigerant may be also sealed when the upper plate 20, the lower plate 21, and the intermediate plates 22 are being laminated.

The lower plate 21 opposes to the upper plate 20, and sandwich one or a plurality of the intermediate plates 22 there-between. Although the lower plate 21 is formed of metal, resin, or the like, they are preferably formed of metal with high thermal conductivity, such as copper, aluminum, silver, aluminum alloy, iron, iron alloy, and stainless steel, or rust-free (high durability) metal. The lower plate 21 may be of one of various shapes, such as a rectangle, a lozenge, a circle, an ellipse, and a polygon. Since the heat pipe 18 is formed opposing to the upper plate 20, it is preferable that the shape and the volume are the same as those of the upper plate 20. The rectangle is tends to be adapted considering ease of manufacturing and mounting thereof.

The lower plate 21 preferably includes a recess part 24 communicating with the vapor diffusion path 25 and the capillary channel 26 on a surface thereof opposing to the intermediate plates 22. Providing the lower plate 21 with the recess part 24 possesses the same meaning as providing the upper plate 20 with the recess part 24.

For convenience, the lower plate 21 is called as "lower", however, the plate does not need to be a lower position physically, and does not need to be distinguished from the upper plate 20 specifically.

It is also suitable for the lower plate 21 to provide with a projection joined to the intermediate plates 22 and an adhesion part.

Moreover, there is no specific problem whether the lower plate 21 is near to the heat radiating surface or the heat receiving surface.

The one or plurality of intermediate plates 22 are laminated between the upper plate 20 and the lower plate 21. Although the intermediate plates 22 is formed of metal, resin, or the like, it is preferably formed of metal with high thermal conductivity, such as copper, aluminum, silver, aluminum alloy, iron, iron alloy, and stainless steel. Moreover, the intermediate plate may be of one of various shapes, such as a rectangle, a lozenge, a circle, an ellipse, and a polygon. Since the heat pipe 18 is formed by sandwiching the upper plate 20 and the lower plate 21, it is preferable that the upper plate 20 and the lower plate 21 of the same shape. Areas of the intermediate plates 22 may be the same as those of the upper plate 20 and the lower plate 21, or may be slightly less than those.

The intermediate plates 22 may include a projection and an adhesion part used when connecting to the upper plate 20 and the lower plate 21. In addition, the intermediate plates 22 include the internal through hole 23 having a minute cross-section area. This internal through hole 23 forms the capillary channel 26.

Finally, the intermediate plates 22 are laminated and connected between the upper plate 20 and the lower plate 21, thereby forming the heat pipe 18. The intermediate plates 22 may be composed of one board or a plurality of boards. However, in order to form the capillary channel 26 having a minute cross-section area as mentioned later, the intermediate plates 22 are preferably composed of the plurality of boards.

Next, the intermediate plates 22, the vapor diffusion path 25, and the capillary channel 26 will be explained, also referring to FIG. 7. First, the vapor diffusion path 25 will be explained. The intermediate plates 22 includes a notched part 29 and the internal through hole 23.

The notched part 29 forms the vapor diffusion path 25 in the heat pipe 18. When the intermediate plates 22 are laminated between the upper plate 20 and the lower plate 21, then the notched part 29 forms an opening. This opening forms the vapor diffusion path 25.

The notched part 29 is formed towards a plane direction of the heat pipe 18, and then the vapor diffusion path 25 is also formed towards the plane direction of the heat pipe 18. For this reason, the vaporized refrigerant is diffused in the plane direction. In addition, since the notched part 29 is connected to the upper plate 20 and the lower plate 21, and the vapor diffusion path 25 is connected from the upper plate 20 to the lower plate 21. Furthermore, the recess part 24 provided with the upper plate 20 and the lower plate 21 communicates with the vapor diffusion path 25. As a result, the vapor diffusion path 25 diffuses the evaporated refrigerant in the plane and thickness directions.

As especially illustrated in FIG. 7, when the notched part 29 is radially formed from the central part of the intermediate plates 22, the vapor diffusion path 25 is also radially formed from the central part of the heat pipe 18. In many cases the heating element is arranged in a substantially central part of the heat pipe 18, the refrigerant receives heat in most in the substantially central part of the heat pipe 18. For this reason, the refrigerant near the central part of the heat pipe 18 evaporates first. At this time, the vapor diffusion path 25 easily and radially diffuses the refrigerant vaporized near the substantially central part of the heat pipe 18.

Thus, the intermediate plates 22 includes the notched part 29 to form the vapor diffusion path 25 spreading in plane and thickness directions, and the refrigerant evaporated in inside of the heat pipe 18 is diffused in the plane and thickness directions. As a result, the heat from the heating element is diffused in inside of the heat-pipe 18 in the plane and thickness directions.

The vapor diffusion path 25 may be of the radial shape shown in FIG. 7, or of another shape.

Next, the capillary channel 26 will be explained. The intermediate plates 22 include the internal through hole 23. The internal through hole 23 is a minute through hole, and forms the capillary channel 26 where the condensed refrigerant circulates. As illustrated in FIG. 3, when the intermediate plates 22 includes the notched part 29, the internal through hole 23 is formed in portions other than the notched-part 29.

Herein, when the intermediate plates 22 is composed of one number, the internal through hole 23 provided in the intermediate plates 22 becomes the capillary channel as it is.

On the other hand, when the intermediate plates 22 is composed of a plurality of members, only a part of internal through hole 23 provided in each of the plurality of intermediate plates 22 overlaps with each other, and the capillary channel 26 having a cross-section area smaller than the cross-section area of the internal through hole 23 in the plane direction is formed. Thus, since the capillary channel 26 having the cross-section area smaller than the cross-section area of the internal through hole 23 itself is formed when the intermediate plates 22 is composed of a plurality of members, circulating of the condensed refrigerant in the capillary channel 26 can be made more effective. This is because the capillary channel 26 makes the refrigerant condensed circulate according to capillarity, thereby promoting to circulation of the refrigerant caused by the small cross-section area of the capillary channel 26.

A plurality of internal through holes 23 are formed in the intermediate plates 22. This is because the internal through holes 23 is preferably plural considering a function as the capillary channel 26.

The internal through hole 23 penetrates the intermediate plates 22 from the front surface to the rear face thereof, and a shape thereof may be a circle, an ellipse, or a rectangle. Considering that only the part of internal through hole 23 overlaps to form the capillary channel 26, the internal through hole 23 is preferably of a rectangle. This is suitable also considering ease of manufacturing.

The internal through hole 23 may be formed by digging, pressing, wet etching, dry etching, or the like. It is preferably formed by etching process, such as wet etching, dry etching, or the like considering minute processing and processing precision.

When the intermediate plates 22 is composed of a plurality of members, the internal through hole 23 is formed in each of the plurality of intermediate plates 22. Herein, since the plurality of intermediate plates 22 are laminated so that the parts of the internal through holes 23 only partially overlap, respectively, positions of the internal through holes 23 preferably shift every adjacent intermediate plate 22. For example, a position of an internal through hole 23 in a certain intermediate plate 22 and a position of an internal through hole 23 in an intermediate plate 22 adjacent to the certain intermediate plate 22 shift so that only parts of these internal through holes 23 overlap. Thus, since the positions of the internal through holes 23 shift every adjacent intermediate plates 22, the capillary channel 26 having a cross-section area smaller than the cross-section area of the internal through hole 23 in the plane direction is formed.

Holes having the cross-section area smaller than the cross-section area of the internal through hole 23 are laminated in the vertical direction of the heat pipe 18, and then a vertical path is formed. The holes are stairs-like in the vertical direction, the path allowing flow not only in the vertical direction but also in the horizontal direction is formed. The cross-section area of the path formed in the vertical and horizontal directions is very small, and causes the condensed refrigerant to circulate in the vertical and horizontal directions.

There is also a merit that the capillary channel 26 can be made more easily than a case where it is directly made when causing only parts of the internal through holes 23 to overlap, thereby forming the capillary channel 26 whose cross-section area is smaller than that of the internal through hole 23.

The condensed refrigerant normally circulates the capillary channel 26, and the vaporized refrigerant may also pass through it.

Angle parts of the capillary channel 26, the recess part 24, and the notched part 29 are preferably beveled and/or rounded. The section of the capillary channel 26 may have one of various shapes, such as a hexagon, a circle, an ellipse, a rectangle, a polygon, or the like. The section of the capillary channel 26 is determined according to the shapes of the internal through holes 23, and how the internal through holes 23 overlap. The cross-section area is determined similarly.

The thermal diffusing unit 403 possesses the architecture described hereinabove and diffuses heat deprived from the recess part 402.

It is also suitable that the cooling device 400 provides a heat radiating unit to radiate the heat diffused by the heat diffusing unit 403.

Figure 28:
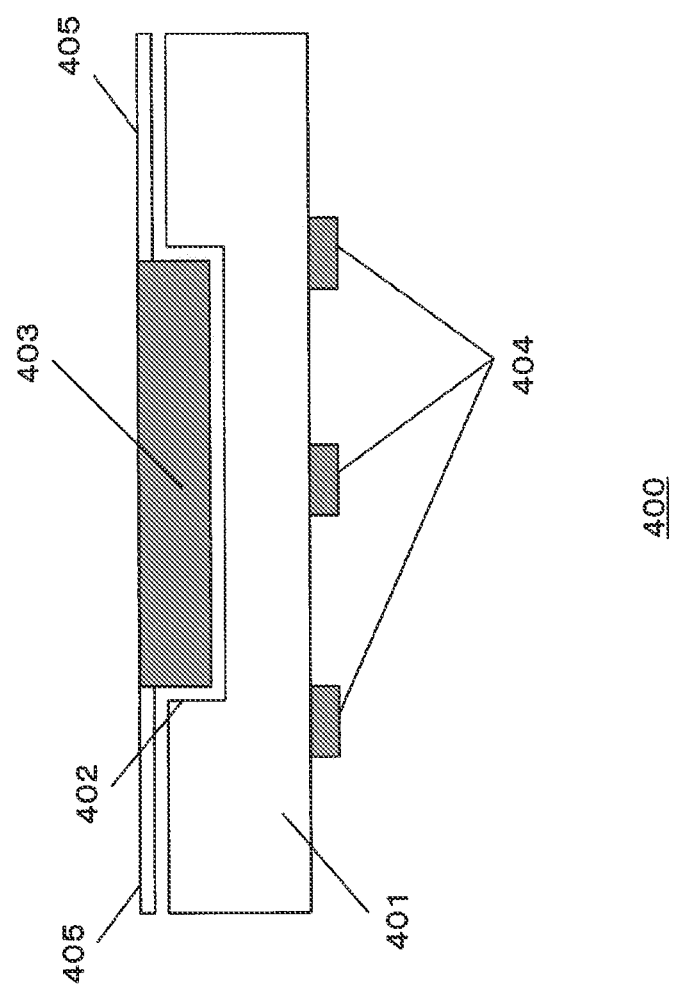
FIG. 28 is another side view of the cooling device shown in FIG. 26.

FIG. 28 is the side view of the cooling device.

The cooling device 400 shown in FIG. 28 possesses the electronic board 401 that holds the recess part 402 and the thermal diffusing unit 403 that is to be either mounted or inserted to the recess part 402, and thermally contacts at least a part of the front surface and side of the recess part 402, and furthermore possesses the heat radiating unit 405 to radiate the heat diffused by the thermal diffusing unit 403.

The cooling device 400 possesses the heat radiating unit 405 to radiate the heat diffused by the thermal diffusing unit 403. The heat radiating unit 405 thermally contacts the thermal diffusing unit 403, and the heat will be conducted from the thermal diffusing unit 403. The heat radiating unit 405 will radiate the conducted heat to the outside. At this point of time, the heat radiating unit 405 is made of plate material with the area and shape that can efficiently radiate the heat and radiate the conducted heat by contacting the outer air. Alternatively, the heat radiating unit 405 thermally contacts the case of an electronic device so that the heat conducted from thermal diffusing unit 403 can be diffused into the case of the electronic device.

This is how the heat radiating unit 405 radiates the heat from the thermal diffusing unit 403 to the outside. In addition, the heat radiating unit 405 can be made of either plate-like material or of heat sink.

The heat radiating unit 405 can be composed by the projected part from the side of the thermal diffusing unit 403 due to the fact that the area of at least one of either upper plate, lower plate and intermediate plate is larger than those of the other plates. The thermal resistance when heat is transmitted from the thermal diffusing unit 403 to heat radiating unit 405 becomes smaller as the heat radiating unit 405 and the member composing the thermal diffusing unit 403 are united. The heat radiating unit 405 can efficiently radiate the heat from the thermal diffusing unit 403 when the thermal resistance is small, which reduces the loss in the heat conduction from the thermal diffusing unit 403 to the heat radiating unit 405.

In addition, the thermal diffusing unit 403 can be thermally contact the recess part 402 via Thermal Interface Material.

The heat radiating unit 405 can extend outside the electronic board 401 so that the heat radiating unit 405 can radiate the heat by thermally contacting the case set outside the electronic board 401. It can also be suitable to set a fin at the end of the heat radiating unit 405 or to set a cooling fan that blow the cool air into the heat radiating unit 405, or to set a liquid-cooled jacket to cool the heat radiating unit 405 when the heat radiating unit 405 is extended outside.

Additionally, it is also suitable that the heat radiating unit 405 possesses the bent and refraction to meet the shape and the size of the case of an electronic device or that it has connection member that is connectable with other heat radiating plates.

Next the cases where the electronic board 401 possesses the thermal via and where the thermal diffusing unit 403 deprives the heat from heating element 404 via thermal via.

Figure 29:
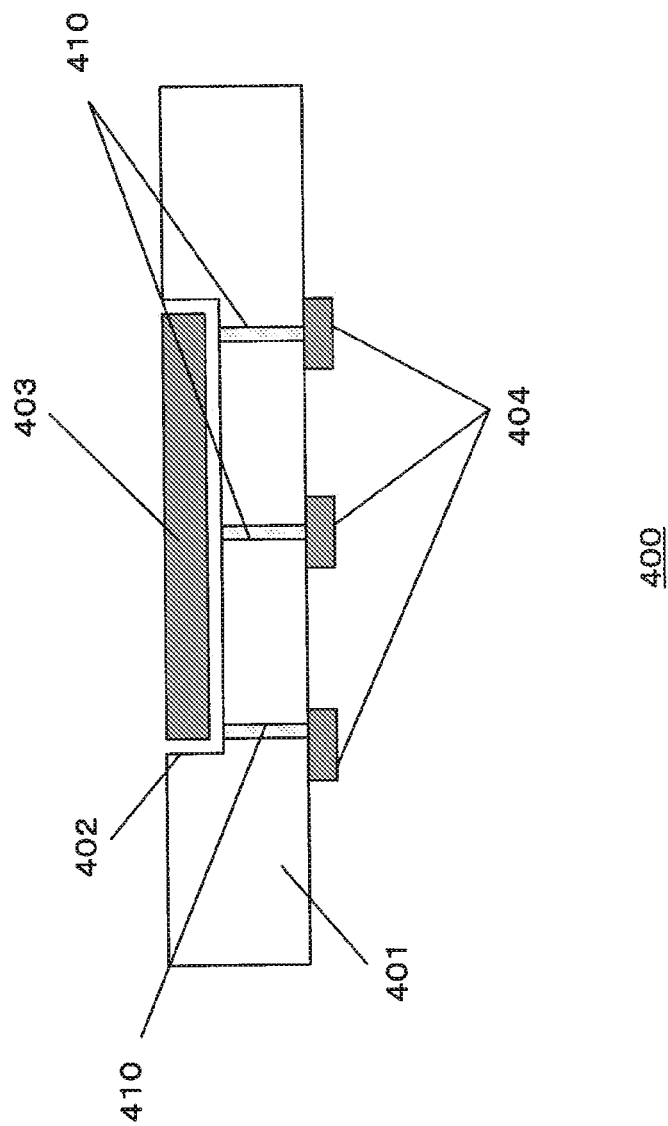
FIG. 29 is another side view of the cooling device shown in FIG. 26.

FIG. 29 is the side view of the cooling device. FIG. 29 shows the architecture that the electronic board 401 possesses the thermal via 410 and that the thermal diffusing unit 403 deprives the heat of heating element 410 via the thermal via 410.

The cooling device 400 shown in FIG. 29 possesses the electronic board 401 that holds the recess part 402 and the thermal diffusing unit 403 that is to be mounted to the recess part 402, and thermally contacts at least a part of the front and rear surface of the recess part 402. The electronic board 401 mounts the heating element 404 on the surface opposing the recess part 402, and the electronic board 401 possesses the thermal via 410 that thermally connects the heating element 404 and recess part 402.

An electronic part that works as the heating element 404 is often mounted on the circuit surface opposing the recess part 402 (opposite circuit surface) in the electronic board 401. Especially a small electronic part though highly calorific such as a light-emitting element or a power device is mounted on the circuit surface opposing the recess part 402. These heating element 404 conduct heat to the recess part 402 through the electronic board 401. However, heat conduction can be insufficient depending upon the materials of the electronic board 401. The thermal via 410 efficiently conducts the heat generated by the heating element 404 to the recess part 402.

The thermal via 410 can be either a through-hole pierced in the electronic board 401 or a through-hole whose inner-perimeter is coated with the highly thermally-conductive material. In the latter case, the heat from the heating element 404 reaches the recess part 402 from the electronic board 401 through the highly thermally-conductive material. The heat from the heating element 404 will be conducted to the thermal diffusing unit 403 and the thermal diffusing unit 403 will diffuse the heat after the heat reaches the recess part 402.

The thermal diffusing unit 403 holds heat-pipe structure and diffuses the heat that is deprived through the repetition of vaporization and condensation of the enclosed refrigerant. The diffused heat is radiated to the outside from the surface of the thermal diffusing unit 403 or from the heat radiating unit described by FIG. 28. At this time, the heat of the heating element 404 that is diffused by the thermal diffusing unit 403 can be radiated to outside by having the thermal diffusing unit 403 or heat radiating unit thermally contacts the case of the electronic device that sores the electronic board 401.

Furthermore, the cooling device 400 shown by FIG. 29 is inserted in the recess part 402 of the electronic board 401, thus the appearance of the electronic board 401 will not be damaged. This means that there will be no unnecessary projection found in the cooling device 400. Thus, there will be no troubles in the mounting of the cooling device 400 to electronic devices. In addition, because the thermal diffusing unit 403 is inserted in the recess part 402, the distance between the thermal diffusing unit 403 and the heating element 404 will be contracted. Consequently, the thermal diffusing unit 403 efficiently deprives the heat from the heating element 404 via ther thermal via 410.

The recess part 402 can mount the heating element such as electronic parts on the surface.

Figure 30:
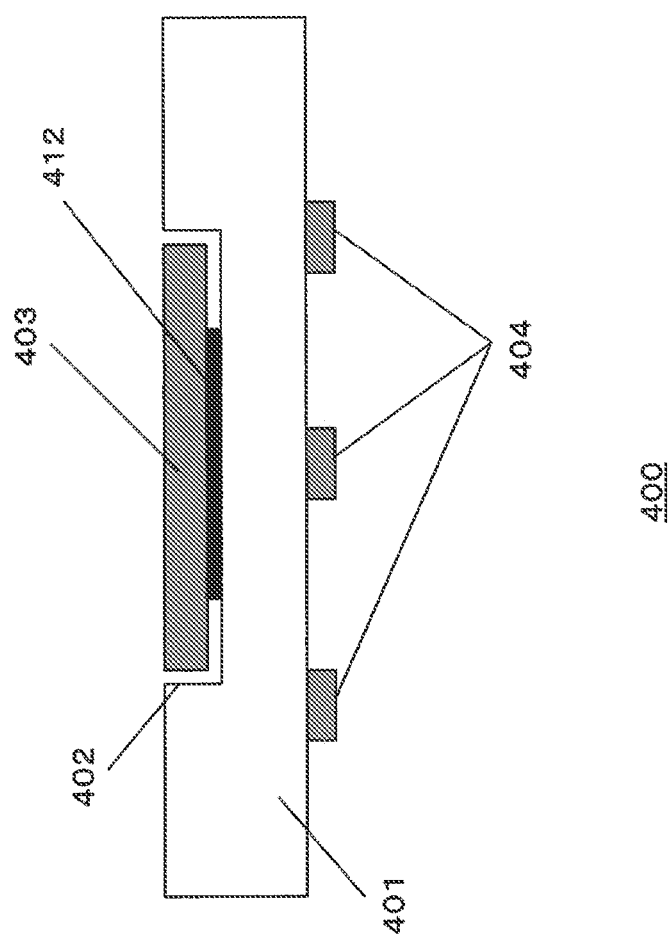
FIG. 30 is another side view of the cooling device shown in FIG. 26.

FIG. 30 is the side view of the cooling device. FIG. 30 indicates that the heating element is mounted on the surface of the recess part 402 and that the thermal diffusing unit 403 holds the structure to deprive the heat from the heating elements.

The cooling device 400 shown in FIG. 30 possesses the electronic board 401 that holds the recess part 402 and the thermal diffusing unit that is to be mounted or inserted to the recess part 402, and thermally contacts at least a part of the front surface, rear surface and the side of the recess part 402. The heating element 412 is mounted on the surface of the recess part 402 and the thermal diffusing unit 403 will thermally contacts the heating element 403.

A large-volume CPU, for example, can be mounted in the recess part 402 with the thermal diffusing unit 403. The large-volume CPU is often mounted at a certain position of a certain surface of the electronic board 401 and generates a large-volume of heat.

Therefore, it is desirable that the cooling device 400 thermally contact the thermal diffusing unit 403 to the heating element 412. Furthermore, it is desirable to populate/mount large-size electronic part and the thermal diffusing unit 403 onto the electronic board 401 without projecting the outer shape of the electronic board 401.

The electronic board 401 possesses the recess part 402, and the heating element 412 is mounted in the recess part 402. The thermal diffusing unit 403 is to be installed in the recess part 402 so that it will thermally contact the heat element 412. The thermal diffusing unit 403 will deprive the heat from the heating element 412 to diffuse, and will radiate the heat it deprived to outside if needed.

There will be no unnecessary projection from the electronic board 401 when a large-scale heating unit 412 including a CPU and the thermal diffusing unit 403 where the large-scale heating unit 412 is cooled is installed in the recess part 402, which will make it easier to store the electronic board in an electronic device. Also, manufacturing and distribution of electronic boards with the cooling devise 400 installed will become easy because of the plain-looking appearance, and thus it will be easier for electronic board supplier and electronic parts supplier to deal with it as their products.

Figure 31:
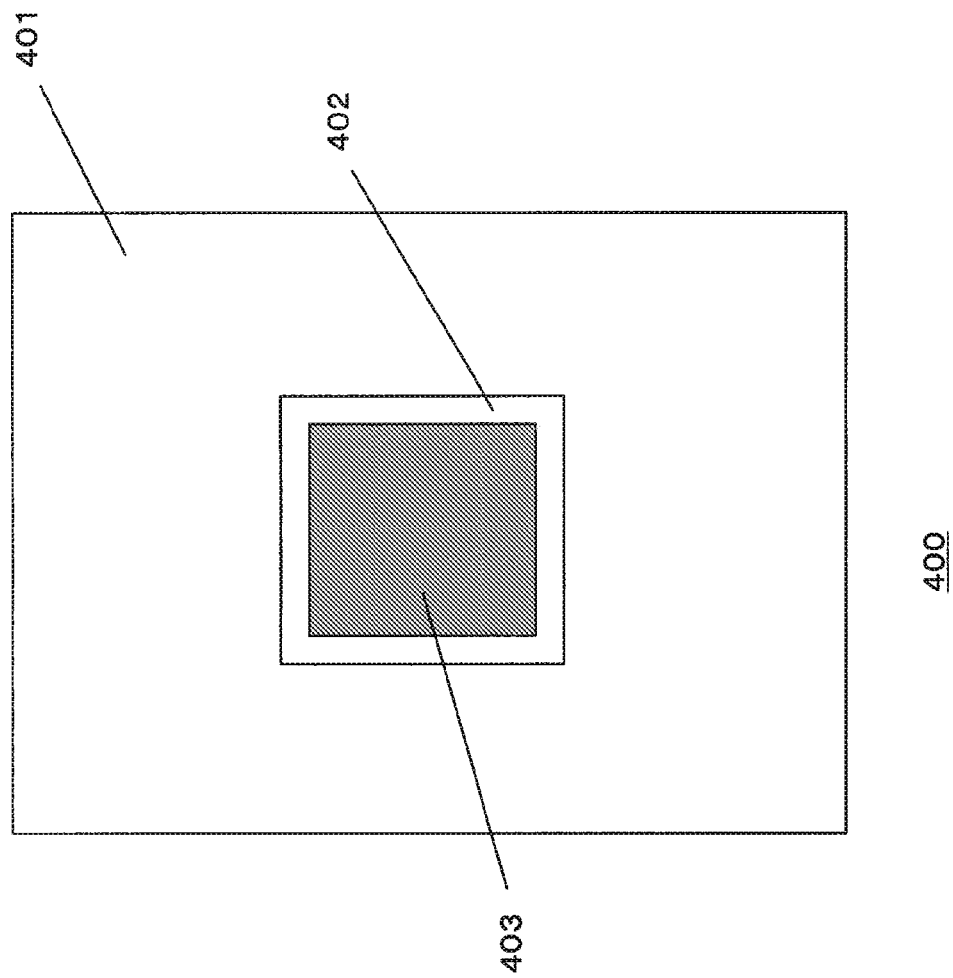
FIG. 31 is a top view of the cooling device shown in FIG. 26.

FIG. 31 is an overhead view of the cooling device that are explained using FIGS. from 27 to 31. FIG. 31 is an overhead view of the cooling device. As indicated in FIG. 31, the electronic board 401 possesses the recess part 402, where the thermal diffusing unit 403 is either inserted or installed.

At least a part of the front surface, rear surface and the side of this thermal diffusing unit 403 will thermally contacts at least a part of the front surface or side of the recess part 402. Consequently, the thermal diffusing unit 403 deprives and diffuses the heat from either the electronic board 401 or the heating element mounted on the electronic board 401 and radiates it to outside.

The recess part 402 may be installed in the vicinity of the center of electronic substrate 401, or may be installed at the edge of it as shown in FIG. 31. The location of the recess part 402 can be decided to meet the shape of the electronic board 401 or the mounting condition of electronic parts.

FIGS. from 27 to 30 are the side view of the electronic board 401. In order to help clear understanding of the condition, they are shown in the cross sectional dimensions based on the recess part 402.

As is explained hereinabove, the cooling device 400 will not make any unnecessary projections to the appearance of an electronic board when the thermal diffusing unit 403 is installed in the recess part 402 that is provided in the electronic board 401, which will make it easier to store it in an electronic device.

While a preferred embodiment of the Present Disclosure is shown and described, it is envisioned that those skilled in the art may devise various modifications without departing from the spirit and scope of the foregoing Description and the appended Claims.

What is claimed is:

1. A cooling device, the cooling device including an electronic substrate on which at least one heating element is mounted, the cooling device comprising:
a thermal diffusion unit of a plate-like shape, the thermal diffusion unit being disposed within the electronic substrate, the thermal diffusion unit comprises an upper plate, a lower plate opposing the upper plate and one or more intermediate plates laminated between the upper plate and the lower plate, each intermediate plate forms at least one of a vapor diffusion path and a capillary channel;
wherein:
a front surface of the thermal diffusion unit thermally contacts a first circuit mounting surface of the electronic substrate;
a rear surface of the thermal diffusion unit thermally contacts a second circuit mounting surface of the electronic substrate; and
the thermal diffusion unit diffuses heat from each heating element according to vaporization and condensation principles of a refrigerant sealed therein.

2. The cooling device of claim 1, wherein, when the electronic substrate comprises a multilayer substrate including a plurality of circuit layers, the first circuit mounting surface and the second circuit mounting surface each having a circuit layer included in the multilayer substrate, and each circuit layer thermally contacts at least a part of a front surface, a rear surface and a side surface of the thermal diffusion unit.

3. The cooling device of claim 1, wherein, when the electronic substrate comprises a plurality of circuit boards the first circuit mounting surface and the second circuit mounting surface each include one of the plurality of circuit boards.

4. The cooling device of claim 3, wherein the thermal diffusion unit thermally contacts at least one of the heating elements mounted on the first circuit mounting surface and the second circuit mounting surface.

5. The cooling device of claim 4, wherein a refrigerant is sealed in an internal space formed by the upper plate, the lower plate and each intermediate plate.

6. The cooling device of claim 5, wherein:
each intermediate plate includes a notched part and an internal through hole;
the notched part forms the vapor diffusion path;
the internal through hole forms the capillary channel;
the vapor diffusion path horizontally and vertically diffuses an evaporated refrigerant; and
the capillary channel causes a condensed refrigerant to horizontally and vertically circulate.

7. The cooling device of claim 6, wherein:
each intermediate plate is composed of a plurality of boards; and
the internal through holes formed in each board partially overlap with each other, thereby forming the capillary channel possessing a cross-section area smaller than cross-section areas in a horizontal direction of the internal through holes.

8. The cooling device of claim 7, wherein the upper plate and the lower plate each comprise a recess part communicating with at least one of the capillary channel and the vapor diffusion path.

9. The cooling device of claim 8, further comprising a connection member that thermally contacts at least a part of a side of the thermal diffusion unit.

10. The cooling device of claim 9, further comprising:
an extension board, the extension board extending from a portion of each side surface, the front surface and the rear surface of the thermal diffusion unit;
wherein the connection member is equipped with the extension board.

11. The cooling device of claim 10, wherein the extension board performs at least one of transporting the heat from the thermal diffusion unit and radiating the heat.

12. The cooling device of claim 11, wherein the extension board extends outside the electronic substrate.

13. The cooling device of claim 12, further comprising a heat radiating unit that radiates heat transported by the extension board.

14. The cooling device of claim 13, wherein the heat radiating unit is selected from the group consisting of a heat sink, a case storing the electronic substrate, a liquid-cooled jacket, a heat radiating board and a cooling fan.

15. The cooling device of claim 14, wherein the extension board is a board member including an attaching part equipped at least with a part of the side of the thermal diffusion unit.

16. The cooling device of claim 15, wherein at least one of the upper plate, the lower plate and each intermediate plate possess an area larger than the other, thereby forming the extension board.

17. The cooling device of claim 16, wherein the thermal diffusion unit further comprises a via-hole that electrically connects the first circuit mounting surface and the second circuit mounting surface.

18. An electronic substrate comprising:
a cooling device;
a first circuit board, the first circuit board including a first circuit mounting surface to which a front surface of a thermal diffusion unit thermally contacts, the thermal diffusion unit being disposed in the cooling device within the electronic substrate, the thermal diffusion unit comprises an upper plate, a lower plate opposing the upper plate and one or more intermediate plates laminated between the upper plate and the lower plate, each intermediate plate forms at least one of a vapor diffusion path and a capillary channel; and
a second circuit board, the second circuit board including a second circuit mounting surface to which a rear surface of the thermal diffusion unit thermally contacts.

19. The electronic substrate of claim 18, wherein the first circuit board and the second circuit board are independently constituted.

20. The electronic substrate of claim 18, wherein the first circuit board and the second circuit board are included in a multilayer substrate.

21. The electronic substrate of claim 20, wherein the thermal diffusion unit is disposed in the multilayer substrate.

22. The electronic substrate of claim 21, wherein the multilayer substrate comprises a thermal via that conducts heat from the thermal diffusion unit to outside of the multilayer substrate.

23. An electronic device comprising:
an electronic substrate, the electronic substrate comprising:
a cooling device;
a first circuit board, the first circuit board including a first circuit mounting surface to which a front surface of a thermal diffusion unit thermally contacts, the thermal diffusion unit being disposed in the cooling device within the electronic substrate, the thermal diffusion unit comprises an upper plate, a lower plate opposing the upper plate and one or more intermediate plates laminated between the upper plate and the lower plate, each intermediate plate forms at least one of a vapor diffusion path and a capillary channel; and a second circuit board, the second circuit board including a second circuit mounting surface to which a rear surface of the thermal diffusion unit thermally contacts;

a case that stores the electronic substrate thereon; and an electric power supply part that supplies electric power to the electronic substrate.

24. The electronic device of claim 23, wherein the electronic device is selected from the group consisting of a notebook personal computer, a desktop personal computer, server equipment, a personal digital assistant, a cell phone and a car-mounted electronic terminal.

* * * * *